(12) United States Patent
Inukai

(10) Patent No.: US 10,718,798 B2
(45) Date of Patent: Jul. 21, 2020

(54) AC VOLTAGE DETECTION DEVICE, IMAGE FORMING APPARATUS, AND INDUSTRIAL MACHINE

(71) Applicant: Brother Kogyo Kabushiki Kaisha, Nagoya-shi, Aichi-ken (JP)

(72) Inventor: Katsumi Inukai, Iwakura (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 5 days.

(21) Appl. No.: 15/936,000

(22) Filed: Mar. 26, 2018

(65) Prior Publication Data

US 2019/0101575 A1    Apr. 4, 2019

(30) Foreign Application Priority Data

Sep. 29, 2017   (JP) ................. 2017-191657

(51) Int. Cl.
```
G01R 19/255      (2006.01)
H02M 1/32        (2007.01)
G01R 15/14       (2006.01)
G01R 19/22       (2006.01)
H02M 1/42        (2007.01)
```
(52) U.S. Cl.
CPC ......... *G01R 19/255* (2013.01); *G01R 15/144* (2013.01); *G01R 19/22* (2013.01); *H02M 1/32* (2013.01); *H02M 1/4258* (2013.01)

(58) Field of Classification Search
CPC .... G01R 19/255; G01R 19/22; G01R 15/144; H02M 1/4258; H02M 1/32

USPC ... 324/676, 710, 765.01, 540–547, 160–170, 324/145, 137, 154 R, 521, 617, 622, 650, 324/76.11, 76.39–76.55

See application file for complete search history.

(56) References Cited

U.S. PATENT DOCUMENTS 5,469,285 A * 11/1995 Gut .................... H04B 10/2503
                                                      375/219
2015/0278667 A1* 10/2015 Tanaka ............... G03G 15/5004
                                                      358/1.14

FOREIGN PATENT DOCUMENTS

| JP | H09-149543 A  | 6/1997  |
| JP | H11-271366 A  | 10/1999 |
| JP | 2002-257872 A | 9/2002  |

* cited by examiner

*Primary Examiner* — Melissa J Koval
*Assistant Examiner* — Trung Nguyen
(74) *Attorney, Agent, or Firm* — Banner & Witcoff, Ltd.

(57) ABSTRACT

An AC voltage detection device has a rectifying circuit configured to rectify an AC voltage output from an AC power source, a voltage-pulse conversion circuit configured to convert a rectified voltage rectified in the rectifying circuit to a first pulse signal having a period shorter than a half of a period of the AC voltage, a pulse transmission circuit configured to perform signal transmission with electrical insulation by converting the first pulse signal to a physical signal other than an electrical signal and converting the physical signal to a second pulse signal being an electrical signal, and a controller to which the second pulse signal is input. The controller calculates the voltage value of the AC voltage from a characteristic value of the second pulse signal.

22 Claims, 15 Drawing Sheets

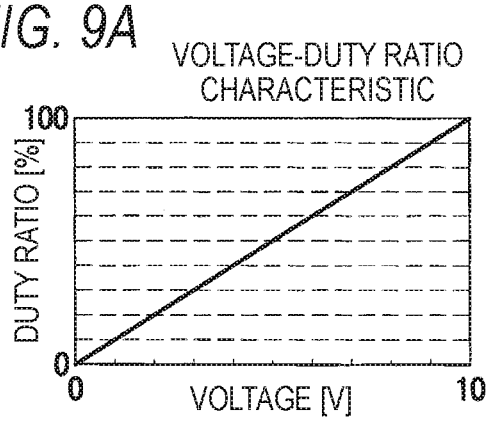
FIG. 9A VOLTAGE-DUTY RATIO CHARACTERISTIC
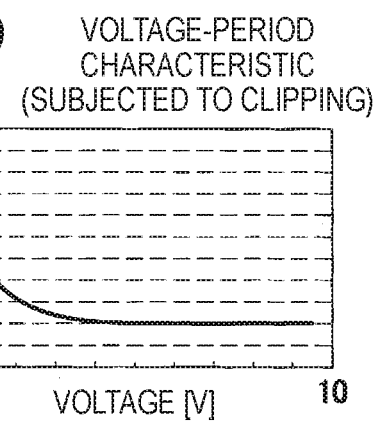
FIG. 9D VOLTAGE-PERIOD CHARACTERISTIC (SUBJECTED TO CLIPPING)
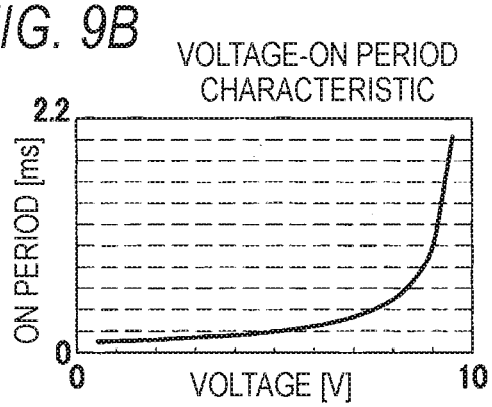
FIG. 9B VOLTAGE-ON PERIOD CHARACTERISTIC
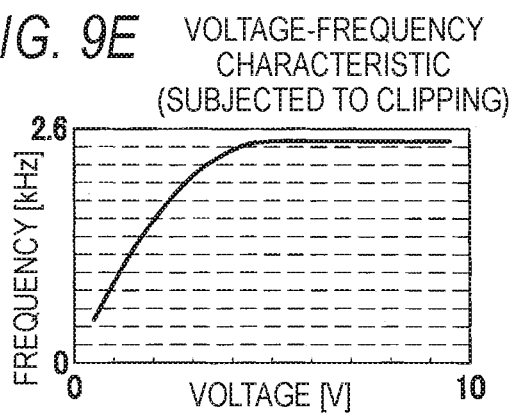
FIG. 9E VOLTAGE-FREQUENCY CHARACTERISTIC (SUBJECTED TO CLIPPING)
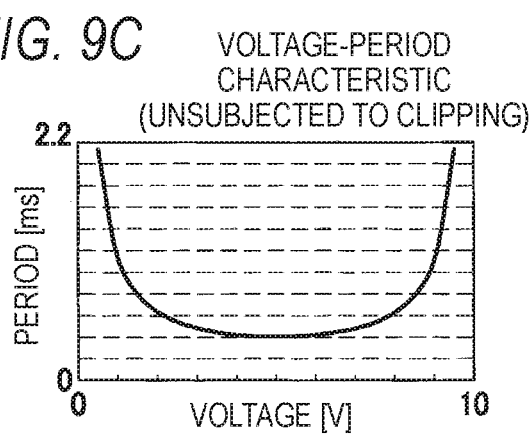
FIG. 9C VOLTAGE-PERIOD CHARACTERISTIC (UNSUBJECTED TO CLIPPING)

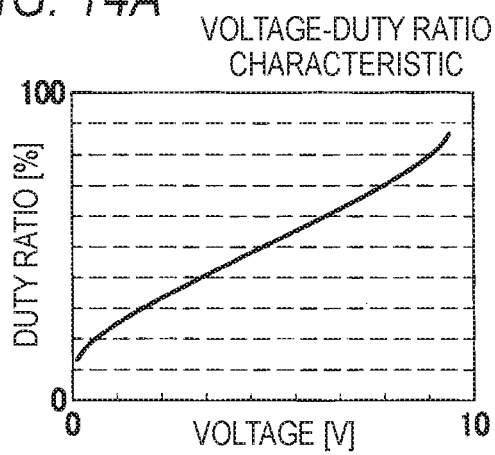
FIG. 14A VOLTAGE-DUTY RATIO CHARACTERISTIC
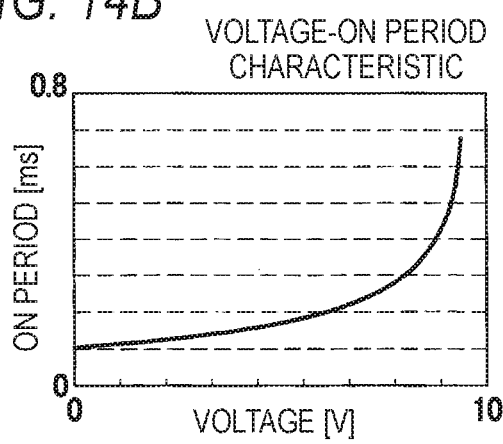
FIG. 14B VOLTAGE-ON PERIOD CHARACTERISTIC
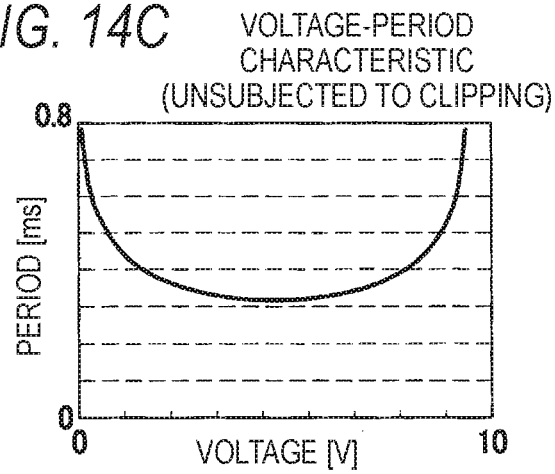
FIG. 14C VOLTAGE-PERIOD CHARACTERISTIC (UNSUBJECTED TO CLIPPING)
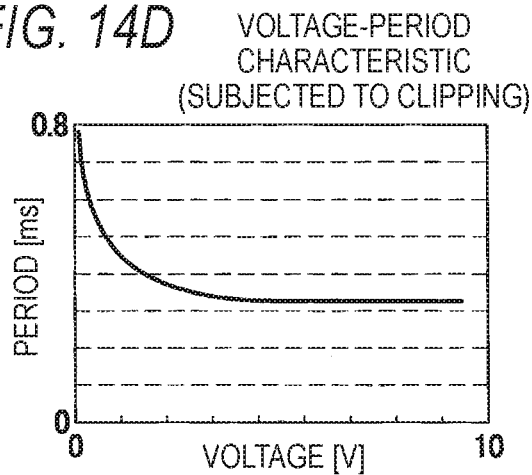
FIG. 14D VOLTAGE-PERIOD CHARACTERISTIC (SUBJECTED TO CLIPPING)
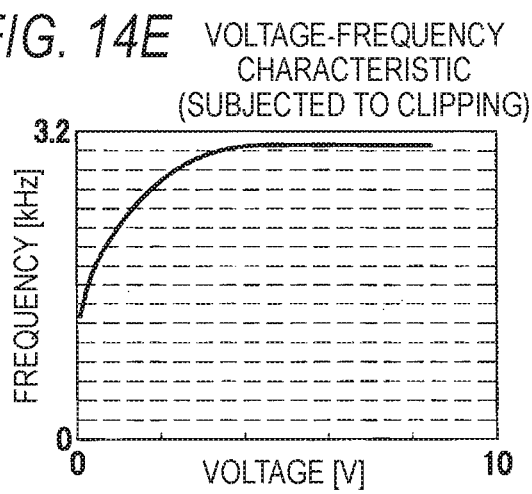
FIG. 14E VOLTAGE-FREQUENCY CHARACTERISTIC (SUBJECTED TO CLIPPING)

AC VOLTAGE DETECTION DEVICE, IMAGE FORMING APPARATUS, AND INDUSTRIAL MACHINE

CROSS-REFERENCE TO RELATED APPLICATION

This application claims priority from Japanese Patent Application No. 2017-191657 filed on Sep. 29, 2017, the entire subject-matter of which is incorporated herein by reference.

TECHNICAL FIELD

The present invention relates to an AC voltage detection device for detecting AC voltage, and an image forming apparatus and an industrial machine having the AC voltage detection device.

BACKGROUND

There has been disclosed an AC voltage detection device having a zener diode, a photocoupler, and a control means for measuring the duration of a signal output from the photocoupler. The photocoupler includes a primary-side light emitting diode and a secondary-side phototransistor. In this technology, in the case where the AC voltage is lower than a predetermined threshold close to 0V, the secondary-side phototransistor is turned on; whereas in the case where AC voltage is higher than the predetermined threshold, the secondary-side phototransistor is turned off.

Therefore, the control means can obtain an output signal corresponding to the ON-OFF state of the secondary-side phototransistor. Further, since the OFF durations of the output signal lengthen as the amplitude of the AC voltage increases, the related-art AC voltage detection device specifies the value of AC voltage on the basis of the OFF durations.

However, in the field of AC voltage detection devices, new methods of detecting an AC voltage by the secondary side unlike the above-described method of the related art are demanded.

SUMMARY

The specification discloses an AC voltage detection device that detects an AC voltage by the secondary side, and an image forming apparatus and an industrial machine including the AC voltage detection device.

One illustrative aspect provides an AC voltage detection device including:

a rectifying circuit configured to rectify an AC voltage output from an AC power source;

a voltage-pulse conversion circuit configured to convert a rectified voltage rectified in the rectifying circuit to a first pulse signal having a period shorter than a half of a period of the AC voltage;

a pulse transmission circuit configured to perform signal transmission with electrical insulation by converting the first pulse signal to a physical signal other than an electrical signal and converting the physical signal to a second pulse signal being an electrical signal; and a controller to which the second pulse signal is input, wherein the controller is configured to calculate a voltage value of the AC voltage from a characteristic value of the second pulse signal.

The aspect provides an image forming apparatus and an industrial machine including the above AC voltage detection device.

According to the AC voltage detection device, the image forming apparatus and the industrial machine, on the side closer to the AC power source than the pulse transmission circuit is, i.e. on the primary side, the rectified voltage is converted to the first pulse signal having a period shorter than a half of a period of the AC voltage by the voltage-pulse conversion circuit. Therefore, it is possible to detect the AC voltage on the other side opposite to the AC power source across the pulse transmission circuit, i.e. on the secondary side.

The aspect provides an AC voltage detection device including:

a rectifying circuit configured to rectify an AC voltage output from an AC power source;

a voltage-pulse conversion circuit configured to convert a rectified voltage rectified in the rectifying circuit to a first pulse signal having a period shorter than a half of a period of the AC voltage;

a capacitor configured to convert the first pulse signal to a second pulse signal; and a controller to which the second pulse signal is input, wherein the controller is configured to calculate the voltage value of the AC voltage from a characteristic value of the second pulse signal.

According to the AC voltage detection device, on the side closer to the AC power source than the capacitor is, i.e. on the primary side, the rectified voltage is converted to the first pulse signal having a period shorter than a half of a period of the AC voltage by the voltage-pulse conversion circuit. Therefore, it is possible to accurately grasp the AC voltage on the other side opposite to the AC power source across the capacitor, i.e. on the secondary side.

According to the present disclosure, it is possible to provide a new method of detecting an AC voltage by the secondary side.

BRIEF DESCRIPTION OF DRAWINGS

FIGS. 9A to 9E are views illustrating the relation between characteristic values of the second pulse signal and voltage.

FIGS. 14A to 14E are views illustrating the relations between characteristic values of a second pulse signal and voltage.

DETAILED DESCRIPTION

First Illustrative Embodiment

A first illustrative embodiment of the present disclosure will be described in detail with reference to appropriate drawings.

Figure 1:
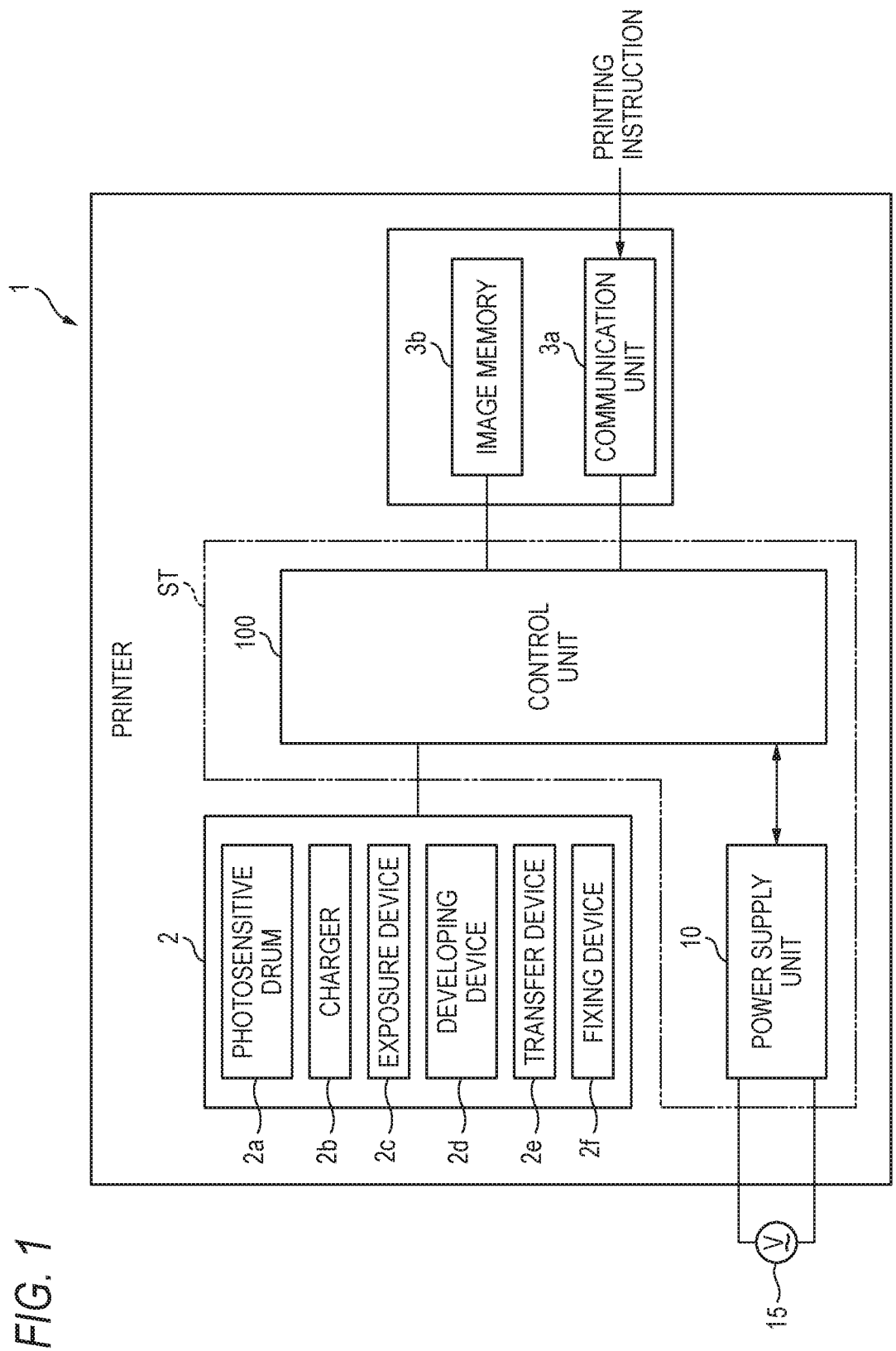
FIG. 1 is a block diagram illustrating a printer according to a first illustrative embodiment.

As shown in FIG. 1, a printer 1 which is an example of an image forming apparatus includes a printing unit 2, a communication unit 3a, an image memory 3b, and a power supply system ST. The power supply system ST includes a power supply unit 10 and a control unit 100. The power supply unit 10 has a function of supplying power to the printing unit 2, the communication unit 3a, the image memory 3b, and the control unit 100. The power supply unit 10 includes various circuits, and is connected to an AC power source 15 which is a commercial power source.

The printing unit 2 includes photosensitive drums 2a, chargers 2b configured to perform a charging process of charging the surfaces of the photosensitive drums 2a, exposure devices configured to perform an exposure process of forming electrostatic latent images on the surfaces of the photosensitive drums 2a, developing devices 2d configured to perform a developing process of attaching developers to the electrostatic latent images formed on the surfaces of the photosensitive drums 2a, thereby forming developer images, a transfer device 2e configured to perform a transfer process of transferring the developer images on a recording medium, a fixing device 2f configured to perform a fixing process of fixing the developer images transferred on the recording medium, and so on.

The printing unit 2 is for performing a printing process of printing print data on recording media by performing charging processes, exposure processes, developing processes, transfer processes, and fixing processes. The communication unit 3a is for performing communication with information terminal devices such as a PC, and has a function of receiving printing instructions and print data from information terminal devices. The image memory 3b is for temporarily storing print data received from information terminal devices.

In the printer 1, if the communication unit 3a receives a printing instruction and print data from an information terminal device, the control unit 100 controls the printing unit 2 such that the printing unit performs a printing process composed of charging processes, exposure processes, developing processes, transfer processes, and fixing processes, thereby printing the print data on recording media. The operating voltage of the printing unit 2 is 24 V; whereas the operating voltages of the communication unit 3a, the image memory 3b, and the control unit 100 are 3.3 V.

Figure 2A:
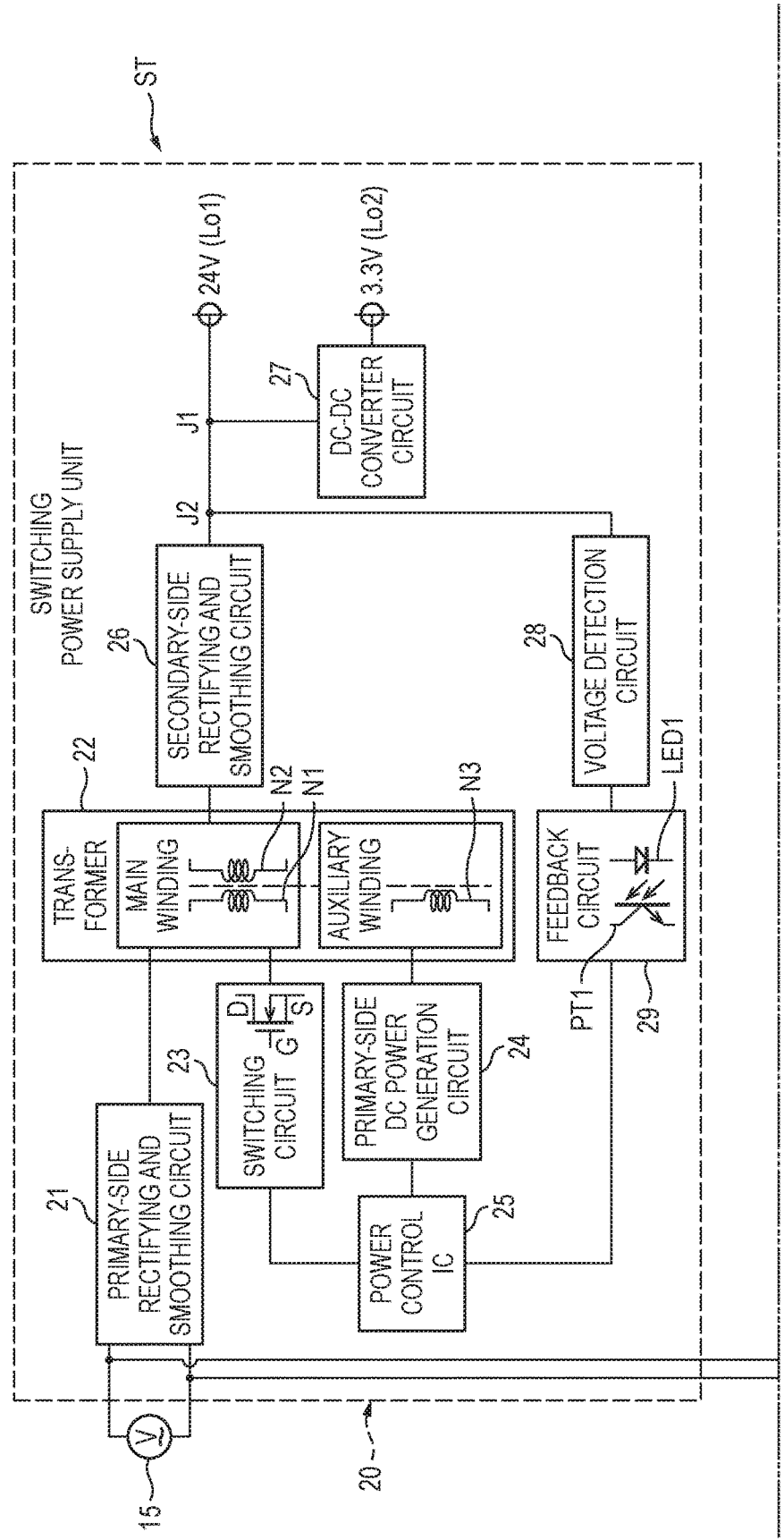
FIGS. 2A and 2B are block diagrams, which together illustrate a power supply system.
Figure 2B:
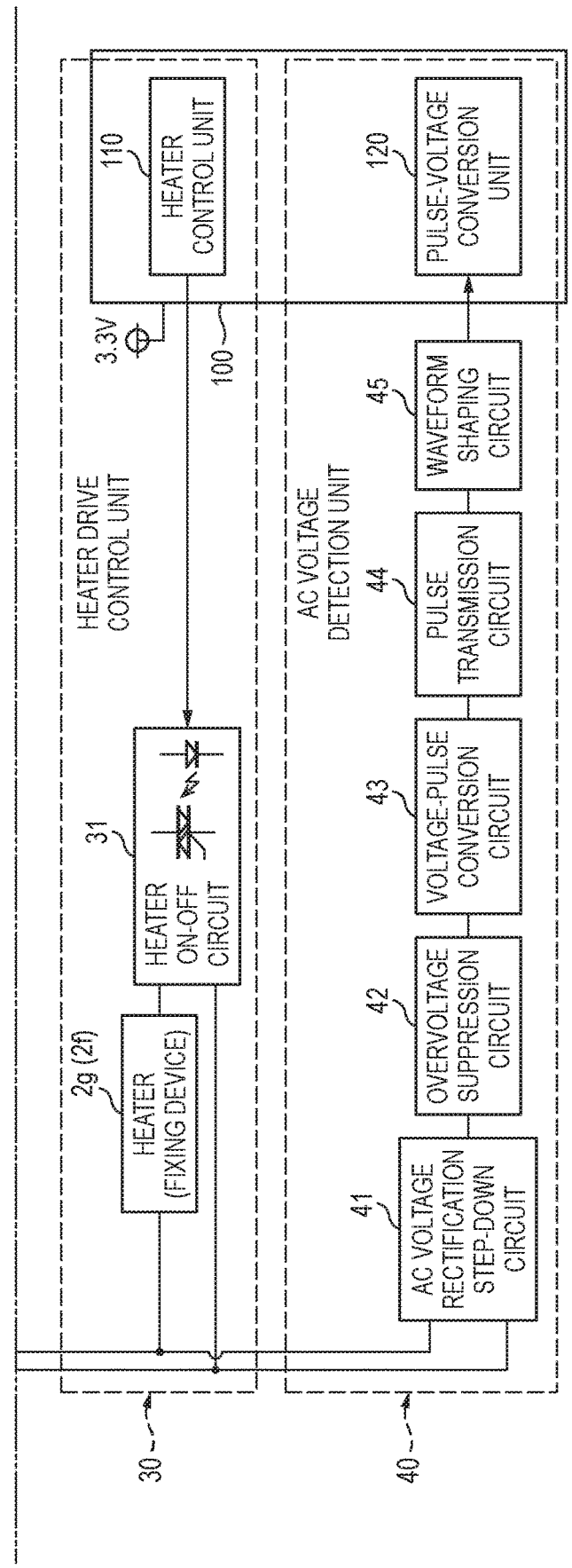

As shown in FIGS. 2A and 2B, the power supply system ST includes a switching power supply unit 20, a heater drive control unit 30, and an AC voltage detection unit 40.

The switching power supply unit 20 has various circuits including a plurality of circuits formed in the power supply unit 10, and has a function of converting the AC voltage of the AC power source 15 to predetermined DC voltages and outputting the DC voltages. Specifically, the switching power supply unit 20 includes a primary-side rectifying and smoothing circuit 21, a transformer 22, a switching circuit 23, a primary-side DC power generation circuit 24, a power control IC 25, a secondary-side rectifying and smoothing circuit 26, a DC-DC converter circuit 27, a voltage detection circuit 28, and a feedback circuit 29.

The primary-side rectifying and smoothing circuit 21 is a so-called capacitor input type, and has a function of rectifying the AC voltage of the AC power source 15 and smoothing the rectified voltage. On the output side of the primary-side rectifying and smoothing circuit 21, the transformer 22 is provided such that an input voltage obtained by rectifying and smoothing the AC voltage is applied to a primary-side coil N1 of the transformer 22.

The switching circuit 23 is an N-channel MOSFET, and the drain D is connected to the primary-side coil N1, and the source S is connected to a primary-side reference potential. Further, an ON-OFF signal (a PWM signal) is input from the power control IC 25 to the gate G, thereby switching on and off the switching circuit 23 with a uniform period. As a result, the primary side of the transformer 22 oscillates, and a voltage is induced in a secondary-side coil N2 of the transformer 22.

On the primary side of the transformer 22, the primary-side DC power generation circuit 24 is provided. The primary-side DC power generation circuit 24 is for rectifying and smoothing a voltage induced in an auxiliary coil N3 provided on the primary side of the transformer 22 by a diode and a capacitor. The voltage of about DC 20V obtained by rectification and smoothing of the primary-side DC power generation circuit becomes power for the power control IC 25. The primary-side DC power generation circuit 24 includes a voltage stabilizer circuit for stabilizing the voltage obtained by rectification and smoothing. The voltage stabilizer circuit of the primary-side DC power generation circuit 24 stabilizes the voltage obtained by rectification and smoothing at DC 10V. The primary-side DC power generation circuit 24 including the voltage stabilizer circuit for generating a first voltage Vcc by stabilizing the voltage obtained by rectification and smoothing is an example of a first DC power supply. The primary-side DC power generation circuit 24 including the diode and the capacitor for generating a second voltage Vdc by rectifying and smoothing the voltage induced in the auxiliary coil N3 is an example of a second DC power supply.

The secondary-side rectifying and smoothing circuit 26 is provided on the secondary side of the transformer 22, and includes a diode and a capacitor. The secondary-side rectifying and smoothing circuit 26 rectifies and smooths the voltage induced in the secondary-side coil N2 of the transformer 22. As a result, the switching power supply unit 20 outputs the voltage of DC 24 V through an output line Lo1.

From a diverging point J1 of the output line Lo1, a branch line diverges, and on that branch line, the DC-DC converter circuit 27 is provided. The DC-DC converter circuit 27 steps down the output voltage Vo1 (DC 24 V) of the switching power supply unit 20 to 3.3 V, and outputs 3.3 V to an output line Lo2.

From a diverging point J2 of the output line Lo1 between the secondary-side rectifying and smoothing circuit 26 and the diverging point J1, a branch line diverges, and on that branch line, the voltage detection circuit 28 is provided. The voltage detection circuit 28 is for detecting the level of the output voltage Vo1 (DC 24 V) of the switching power supply unit 20, and includes a pair of detection resistors and a shunt regulator.

The detection resistors are for detecting a divided voltage obtained by dividing the output voltage Vo1 at the resistance ratio. The shunt resistor outputs a current according to the level difference between a reference voltage of the shunt regulator and the divided voltage to the feedback circuit 29. Since the voltage detection circuit 28 detects the voltage obtained by smoothing of the rectifying and smoothing circuits 21 and 26, it is impossible to detect the voltage value of an AC voltage by the voltage detection circuit 28.

The feedback circuit 29 includes a light emitting diode LED1 and a phototransistor PT1. The light emitting diode LED1 and the phototransistor PT1 constitute a photocoupler.

In the feedback circuit 29, if a current is supplied from the voltage detection circuit 28 to the light emitting diode LED1, the light emitting diode LED1 outputs a light signal having light intensity according to the level difference between the reference voltage and the divided voltage. The light signal of the light emitting diode LED1 is converted to an electrical signal in the phototransistor PT1. According to this configuration, a signal representing the level difference of the divided voltage relative to the reference voltage of the shunt regulator (hereinafter, referred to as a feedback signal) is input (fed back) to the power control IC 25.

The power control IC 25 is connected to the switching circuit 23, the primary-side DC power generation circuit 24, and the feedback circuit 29. The power control IC 25 includes a PWM comparator and an oscillator circuit for generating a triangular wave, and if a feedback signal is input, the power control IC generates a PWM signal according to the feedback signal, and outputs the PWM signal to the gate G of the switching circuit 23. As a result, the output voltage Vo1 of the switching power supply unit 20 is regulated to a target voltage (DC 24 V). Further, the power control IC 25 has a function of stopping and restarting switching control (ON-OFF control) on the switching circuit 23 in response to a control signal output from the control unit 100.

The heater drive control unit 30 includes a heater ON-OFF circuit 31 and a heater control unit 110. The heater ON-OFF circuit 31 is provided in the above-described power supply unit 10 (see FIG. 1), and the heater control unit 110 is provided in the control unit 100.

The heater ON-OFF circuit 31 is connected to the AC power source 15 via a heater 2g provided in the fixing device 2f. The heater ON-OFF circuit 31 is configured to be able to be switched between an ON state for applying the AC voltage from the AC power source 15 to the heater 2g and an OFF state for stopping application of the AC voltage to the heater 2g.

The heater control unit 110 has a function of switching the state of the heater ON-OFF circuit 31, thereby performing ON-OFF control on the AC voltage to be applied to the heater 2g.

The AC voltage detection unit 40 is an example of an AC voltage detection device for detecting the AC voltage output from the AC power source 15, and is connected to the AC power source 15. The AC voltage detection unit 40 includes an AC voltage rectification step-down circuit 41 which is an example of a rectifying circuit, an overvoltage suppression circuit 42, a voltage-pulse conversion circuit 43, a pulse transmission circuit 44, a waveform shaping circuit 45, and a pulse-voltage conversion unit 120. The AC voltage rectification step-down circuit 41, the overvoltage suppression circuit 42, the voltage-pulse conversion circuit 43, the pulse transmission circuit 44, and the waveform shaping circuit 45 are provided in the above-described power supply unit 10 (see FIG. 1), and the pulse-voltage conversion unit 120 is provided in the control unit 100.

Figure 3:
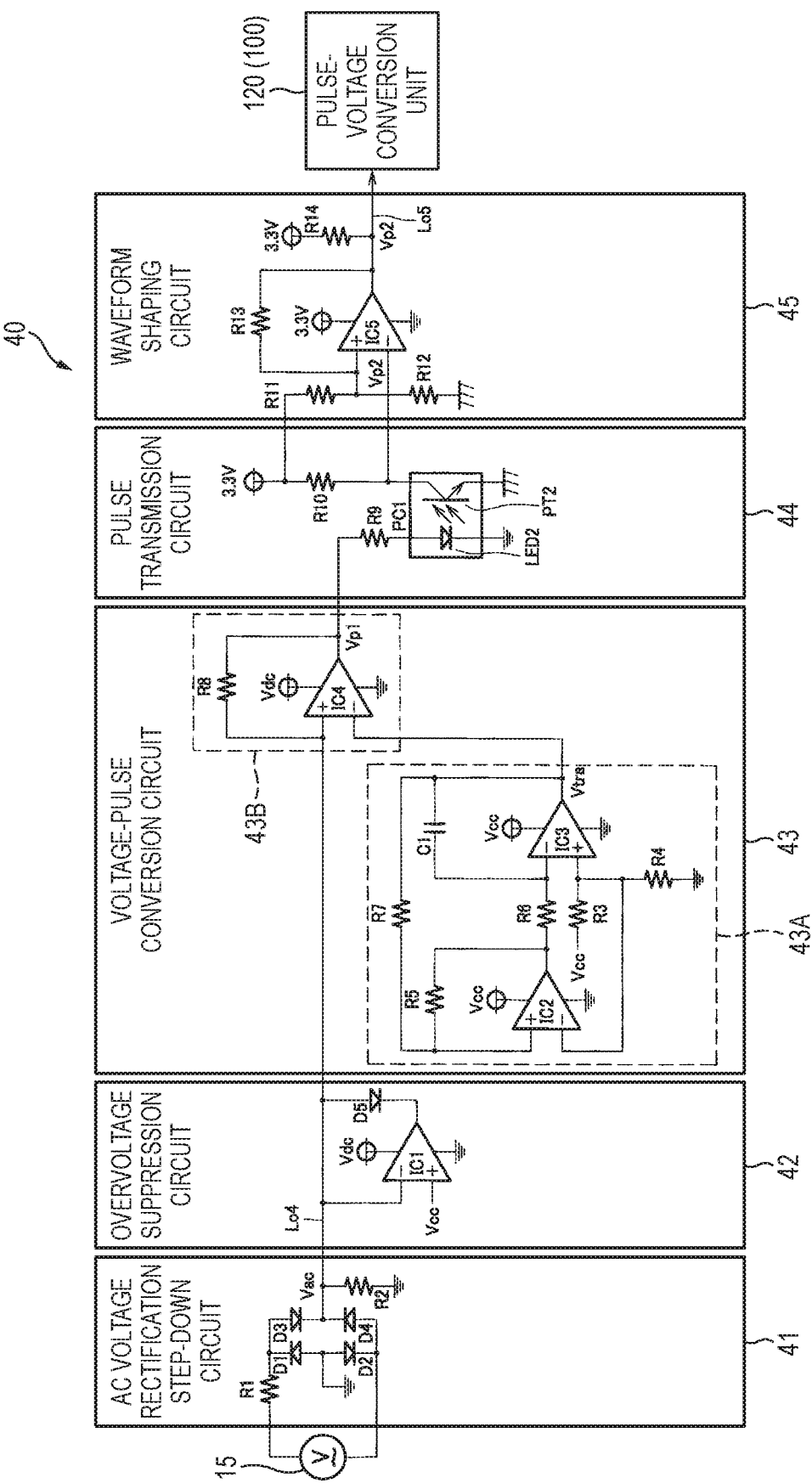
FIG. 3 is a circuit diagram illustrating an AC voltage detection unit.

As shown in FIG. 3, the AC voltage rectification step-down circuit 41 is a bridge diode (four diodes D1 to D4 connected in a bridge configuration), and is connected to the AC power source 15, and has a function of rectifying the AC voltage output from the AC power source 15 and stepping down the rectified voltage. The connection point of the diode D1 and the diode D2 of the bridge diode is grounded. The connection point of the diode D1 and the diode D3 is connected to the AC power source 15 via a resistor R1. The connection point of the diode D2 and the diode D4 is connected to the AC power source 15. The connection point of the diode D3 and the diode D4 is grounded via a resistor R2, and is connected to the overvoltage suppression circuit 42 and the voltage-pulse conversion circuit 43 via an output line Lo4.

The overvoltage suppression circuit 42 is configured to suppress the AC voltage output from the AC voltage rectification step-down circuit 41 from achieving an overvoltage. The overvoltage suppression circuit 42 includes a comparator IC1 and a diode D5. To the non-inversion input terminal (+) of the comparator IC1, the first voltage Vcc is applied from the primary-side DC power generation circuit 24, and to the inversion input terminal (−), rectified voltage Vac is applied from the output line Lo4. To the output terminal of the comparator IC1, the cathode of the diode D5 is connected, and the anode of the diode D5 is connected to the output line Lo4. To the comparator IC1, the second voltage Vdc higher than the first voltage Vcc is applied from the primary-side DC power generation circuit 24. When the rectified voltage Vac is equal to or lower than the first voltage Vcc, if the rectified voltage Vac is applied to the inversion input terminal (−) of the comparator IC1, a high-level signal is output from the output terminal of the comparator IC1. Meanwhile, when the rectified voltage Vac is higher than the first voltage Vcc, i.e. the rectified voltage is an overvoltage, if the rectified voltage Vac is applied to the inversion input terminal (−) of the comparator IC1, a low-level signal is output from the output terminal of the comparator IC1. In this case, since a current flows from the diode D5 toward the ground side of the comparator IC1, it is possible to prevent an overvoltage from being applied to the comparator IC1 and the voltage-pulse conversion circuit 43.

The voltage-pulse conversion circuit 43 is a circuit for converting the rectified voltage Vac rectified in the AC voltage rectification step-down circuit 41 to a first pulse signal Vp1 having a period shorter than a half of a period of the AC voltage. The voltage-pulse conversion circuit 43 includes a triangular wave generating circuit 43A configured to generate a triangular wave having a uniform period shorter than a half of a period of the AC voltage, and a comparing and buffering circuit 43B.

The triangular wave generating circuit 43A includes comparator IC2 and IC3, resistors R3 to R7, and a capacitor C1. To each of the comparator IC2 and IC3, the first voltage Vcc is applied from the primary-side DC power generation circuit 24. The output terminal of the comparator IC2 is connected to the inversion input terminal (−) of the comparator IC3 via a resistor R6. The connection point of the resistor R6 and the inversion input terminal (−) of the comparator IC3 is connected to the output terminal of the comparator IC3 via the comparator IC1. The non-inversion input terminal (+) of the comparator IC3 is connected to the primary-side DC power generation circuit 24 configured to output the first voltage Vcc, via a resistor R3. The connection point of the resistor R3 and the non-inversion input terminal (+) of the comparator IC3 is grounded via the resistor R4.

The inversion input terminal (−) of the comparator IC2 is grounded via the resistor R4. The non-inversion input terminal (+) of the comparator IC2 is connected to the connection point of the resistor R6 and the output terminal of the comparator IC2 via a resistor R5. The non-inversion input terminal (+) of the comparator IC2 is connected to the output terminal of the comparator IC3 via the resistor R7.

In the triangular wave generating circuit 43A, a triangular wave Vtra is output from the output terminal of the comparator IC3. Then, the triangular wave Vtra is input terminal the comparing and buffering circuit 43B. Since the shorter the period of the triangular wave Vtra, the better, in the present illustrative embodiment, the period of the triangular wave is set to a period of about ½₅ of a half period of the AC voltage (see FIG. 4). The minimum value and maximum value of the triangular wave Vtra are set to 0 and the first voltage Vcc, respectively.

The comparing and buffering circuit 43B has a function of comparing the rectified voltage Vac and the triangular wave Vtra and a function of supplying a current for driving the pulse transmission circuit 44 to the pulse transmission circuit 44. The comparing and buffering circuit 43B includes a comparator IC4 and a resistor R8.

To the comparator IC4, the second voltage Vdc is applied from the primary-side DC power generation circuit 24. To the non-inversion input terminal (+) of the comparator IC4, the rectified voltage Vac is input, and to the inversion input terminal (−), the triangular wave Vtra is input. The non-inversion input terminal (+) of the comparator IC4 is connected to the output terminal of the comparator IC4 via the resistor R8.

Figure 4:
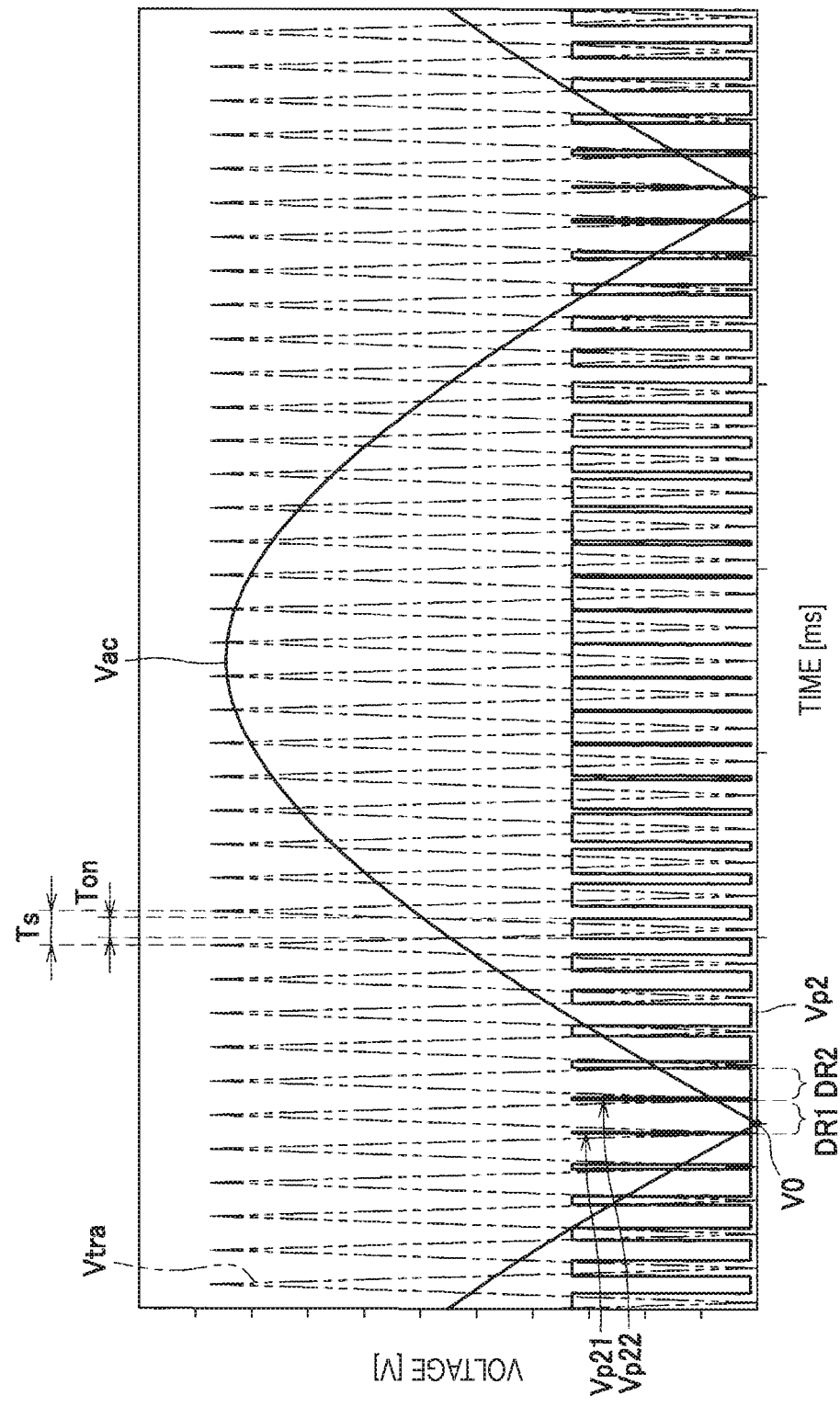
FIG. 4 is a view illustrating the relation of a triangular wave, a rectified voltage, and a pulse signal.
Figure 5A:
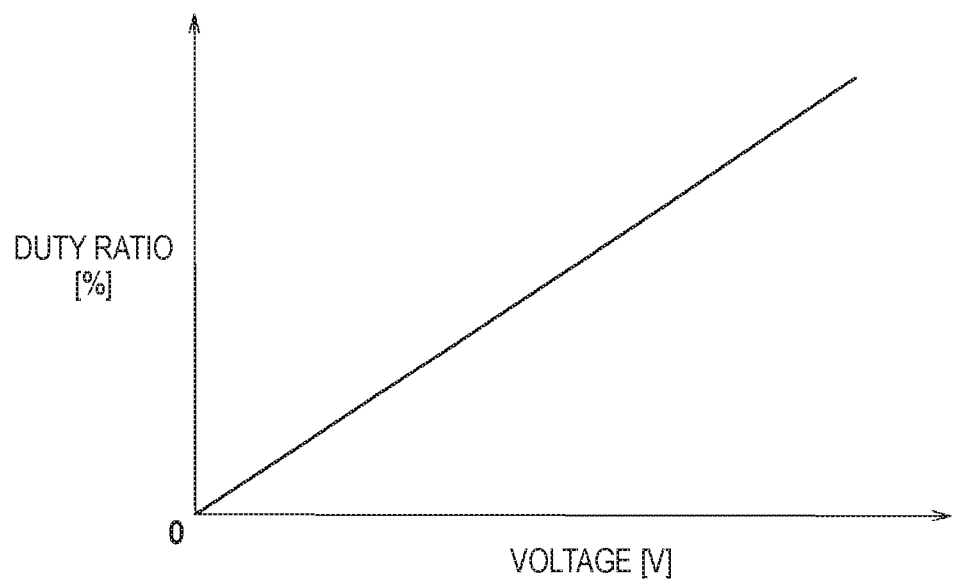
FIG. 5A is a view illustrating the relation between the duty ratio of a second pulse signal and voltage.
Figure 5B:
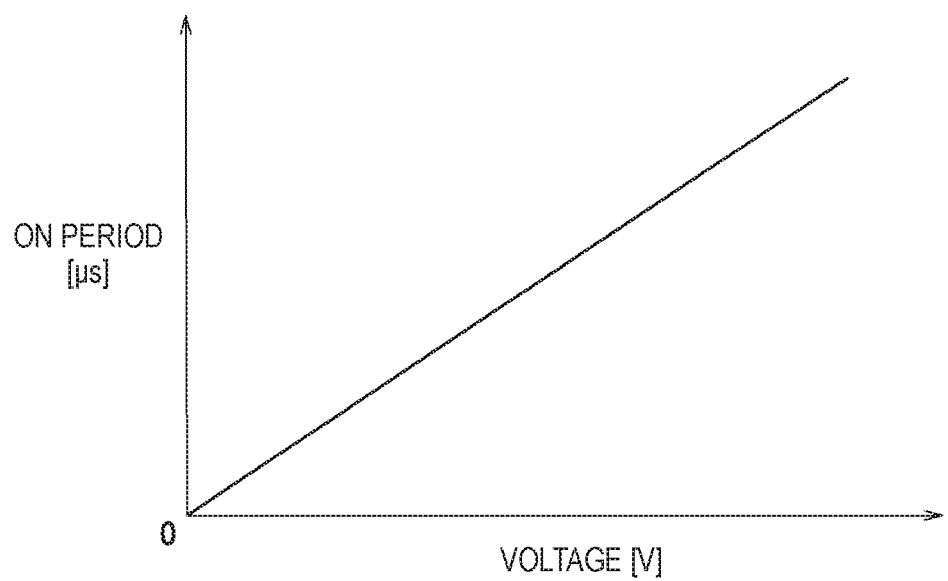
FIG. 5B is a view illustrating the relation between the ON period of the second pulse signal and voltage.

In the comparing and buffering circuit 43B, the rectified voltage Vac and the triangular wave Vtra are compared by the comparator IC4. In the case where the rectified voltage Vac is equal to or higher than the triangular wave Vtra, the output (Vp1) of the comparator IC4 becomes a high output equal to the second voltage Vdc; whereas in the case where the rectified voltage Vac is lower than the triangular wave Vtra, it becomes a low output equal to the ground level (for example, 0V). In this way, the first pulse signal Vp1 is output from the comparing and buffering circuit 43B. Since the high output of the first pulse signal Vp1 is equal to the second voltage Vdc, in the waveform of the first pulse signal Vp1, the period and the level of the low output are the same as those of a second pulse signal Vp2 (to be described below) shown in FIG. 4, and the level of the high output is higher than the level of the high output of the second pulse signal Vp2, and is higher than the maximum value of the rectified voltage Vac and the maximum value of the triangular wave Vtra. The duty ratio of the first pulse signal Vp1 is a ratio of a period (hereinafter, also referred to as an ON period) from a timing when the first pulse signal changes from the low output to the high output to a timing when the first pulse signal changes from the low output to the high output again, i.e. a ratio of a period when the first pulse signal is the high output within a period of the first pulse signal Vp1. As described above, in the present illustrative embodiment, since the period of the triangular wave Vtra is set to be a period of about ½₅ of a half period of the AC voltage, it is sufficiently short as compared to a half period of the AC voltage. For this reason, the period of the first pulse signal Vp1 can be considered as being equal to the period of the triangular wave Vtra and being uniform. Therefore, the duty ratio of the first pulse signal Vp1 can be considered as being [ON Period Ton/Period Ts of Triangular Wave Vtra] as shown in FIG. 4. As shown in FIG. 5B, the ON period is proportional to the voltage value of the AC voltage. Therefore, if the period of the triangular wave Vtra is set to be sufficiently shorter than a half period of the AC voltage, the duty ratio of the first pulse signal Vp1 also is proportional to the voltage value of the AC voltage, as shown in FIG. 5A.

Hereinafter, FIG. 3 will be further described. The pulse transmission circuit 44 is a circuit configured to perform signal transmission with electrical insulation by converting the first pulse signal Vp1 to a physical signal other than an electrical signal and converting the physical signal to the second pulse signal Vp2 being an electrical signal. The pulse transmission circuit 44 includes a photocoupler PC1 and resistors R9 and R10.

The photocoupler PC1 has a function of converting the first pulse signal Vp1 to a light signal which is a physical signal and converting the light signal to the second pulse signal Vp2. The photocoupler PC1 includes a light emitting diode LED2 and a phototransistor PT2. The light emitting diode LED2 is connected to the output terminal of the comparator IC4 via the resistor R9, and is grounded. The phototransistor PT2 is grounded, and is connected to the inversion input terminal (−) of a comparator IC5 of the waveform shaping circuit 45. The phototransistor PT2 is connected to the non-inversion input terminal (+) of the comparator IC5 via the resistor R10 and a resistor R11. To the connection point of the resistor R10 and the resistor R11, a voltage of 3.3 V is applied.

The waveform shaping circuit 45 is a circuit of shaping the waveform of the second pulse signal Vp2 output from the pulse transmission circuit 44. The waveform shaping circuit 45 includes the comparator IC5, the resistor R11, and resistors R12 to R14. To the comparator IC5, a voltage of 3.3 V is applied. The connection point of the resistor R11 and the non-inversion input terminal (+) of the comparator IC5 is grounded via the resistor R12. The non-inversion input terminal (+) of the comparator IC5 is connected to the output terminal of the comparator IC5 via the resistor R13. The output terminal of the comparator IC5 is connected to the pulse-voltage conversion unit 120 via an output line Lo5. To the output line Lo5, a voltage of 3.3 V is applied via the resistor R14. The waveform shaping circuit 45 shapes the second pulse signal Vp2 output from the pulse transmission circuit 44 and having a slightly blunt into a rectangular second pulse signal Vp2 shown in FIG. 4. The rectangular second pulse signal Vp2 shown in FIG. 4 has 3.3 V as its high output level and has the ground level as its low output level.

The waveform shaping circuit 45 shapes the slightly blunt rectangular waveform of the second pulse signal Vp2 by the comparator IC5 such that the second pulse signal Vp2 subjected to shaping has such a rectangular waveform that the high output of 3.3 V and the low output of the ground level (for example, 0V) are readily distinguishable, and then outputs the second pulse signal Vp2 to the pulse-voltage conversion unit 120. Similarly to the first pulse signal Vp1, the duty ratio and the ON period of the second pulse signal Vp2 also are proportional to the voltage value of the AC voltage (see FIGS. 5A and 5B).

The pulse-voltage conversion unit 120 has a function of calculating the voltage value of the AC voltage from a characteristic value of the second pulse signal Vp2 if the second pulse signal Vp2 subjected to shaping is input.

Specifically, the pulse-voltage conversion unit 120 calculates the AC voltage on the basis of the duty ratio of the second pulse signal Vp2. More specifically, the pulse-voltage conversion unit 120 calculates the voltage value on the basis of the duty ratio of the second pulse signal and a map representing the relation between the duty ratio and the voltage value of the AC voltage and shown in FIG. 5A. The pulse-voltage conversion unit 120 detects an ON period by starting a timer when the second pulse signal Vp2 input from the waveform shaping circuit 45 rises and counting a time until the second pulse signal Vp2 falls, and detects a period of the second pulse signal Vp2 by counting a time from a rising of the second pulse signal Vp2 to the next rising of the second pulse signal Vp2, and calculates the duty ratio from the detected ON period and the detected period. However, the pulse-voltage conversion unit 120 may calculate the AC voltage, using an expression representing the relation between the duty ratio and the voltage value of the AC voltage, instead of referring to the map representing the relation between the duty ratio and the voltage value of the AC voltage.

Alternatively, the pulse-voltage conversion unit 120 may calculate the AC voltage on the basis of the ON period of the second pulse signal Vp2.

The pulse-voltage conversion unit 120 has a function of specifying a moment in time when the AC voltage is 0V on the basis of two different duty ratios and moments in time when the two duty ratios are detected in the case where it is impossible to specify the moment in time when the AC voltage is 0V on the basis of the duty ratio of the second pulse signal Vp2. Specifically, as shown in FIG. 4, the pulse-voltage conversion unit 120 specifies two duty ratios DR1 and DR2 consecutively detected, specifically, a duty ratio detected when the AC voltage is closest to 0V and another duty ratio detected when the AC voltage is second closest to 0V, as two duty ratios for calculating a moment when the AC voltage is 0V. Thereafter, the pulse-voltage conversion unit 120 calculates voltage values V1 and V2 corresponding to the duty ratios DR1 and DR2, respectively, on the basis of the duty ratios DR1 and DR2. Subsequently, the pulse-voltage conversion unit 120 specifies a moment V0 when the voltage value is 0V, on the basis of the voltage values V1 and V2. Specifically, if the voltage value V1 and the voltage value V2 are the same, the pulse-voltage conversion unit 120 specifies the middle moment of period between a second pulse signal Vp21 corresponding to a period corresponding to the duty ratio DR1 and a second pulse signal Vp22 corresponding to a period corresponding to the duty ratio DR2, as the moment V0. If the voltage value V1 is smaller than the voltage value V2, the pulse-voltage conversion unit 120 specifies a moment closer to the second pulse signal Vp21 corresponding to the period corresponding to the duty ratio DR1, as the moment V0; whereas if the voltage value V1 is larger than the voltage value V2, the pulse-voltage conversion unit 120 specifies a moment closer to the second pulse signal Vp22 corresponding to the period corresponding to the duty ratio DR2, as the moment V0. Specifically, if the voltage value V1 is not equal to the voltage value V2, the pulse-voltage conversion unit 120 specifies the moment V0 according to the ratio of the voltage values V1 and V2. For example, in the case where the voltage value V1 is smaller than the voltage value V2, if the ratio of the voltage values V1 and V2 is 1:2, the pulse-voltage conversion unit 120 specifies a moment dividing the interval between the second pulse signals Vp21 and Vp22 at the ratio of 1:2, the moment V0. However, due to influence of distortion of the waveform of the AC voltage and the period of the triangular wave Vtra, the moment V0 specified by the pulse-voltage conversion unit 120 may differ from the actual moment V0 of the AC voltage.

An AC voltage detection method of the AC voltage detection unit 40 will be described.

As shown in FIG. 3, if the AC voltage is output from the AC power source 15, the AC voltage is rectified and stepped down by the AC voltage rectification step-down circuit 41. The rectified voltage Vac output from the AC voltage rectification step-down circuit 41 is suppressed from achieving an overvoltage by the overvoltage suppression circuit 42, and is input to the comparator IC4 of the voltage-pulse conversion circuit 43.

The rectified voltage Vac input to the comparator IC4 is compared with the triangular wave Vtra. As a result, the first pulse signal Vp1 is output from the output terminal of the comparator IC4. The first pulse signal Vp1 is converted to a light signal and then is converted to an electrical signal again by the pulse transmission circuit 44. In this way, the first pulse signal Vp1 is converted to the second pulse signal Vp2.

Thereafter, the second pulse signal Vp2 is subjected to shaping by the waveform shaping circuit 45, and then is input to the pulse-voltage conversion unit 120. The pulse-voltage conversion unit 120 calculates the voltage value of the AC voltage on the basis of the duty ratio of the second pulse signal Vp2 and the map shown in FIG. 5A.

According to the above-described configuration, in the present illustrative embodiment, it is possible to obtain the following effects.

Since the primary side, that is, the side close to the AC power source 15 than the pulse transmission circuit 44, converts the AC voltage to the fine first pulse signal Vp1, and the pulse transmission circuit 44 converts the first pulse signal Vp1 to the second pulse signal Vp2, the secondary side (the side close to the control unit 100 than the pulse transmission circuit 44) can detect the AC voltage. Therefore, according to the present illustrative embodiment, it is possible to provide a new method of detecting the AC voltage by the secondary side.

Since the voltage-pulse conversion circuit 43 is configured to include the triangular wave generating circuit 43A and the comparing and buffering circuit 43B, it is possible to convert the rectified voltage Vac to the first pulse signal Vp1 exactly proportional to the rectified voltage Vac. Therefore, it is possible to reduce the load on the control unit 100 during calculation of the AC voltage.

Figure 6:
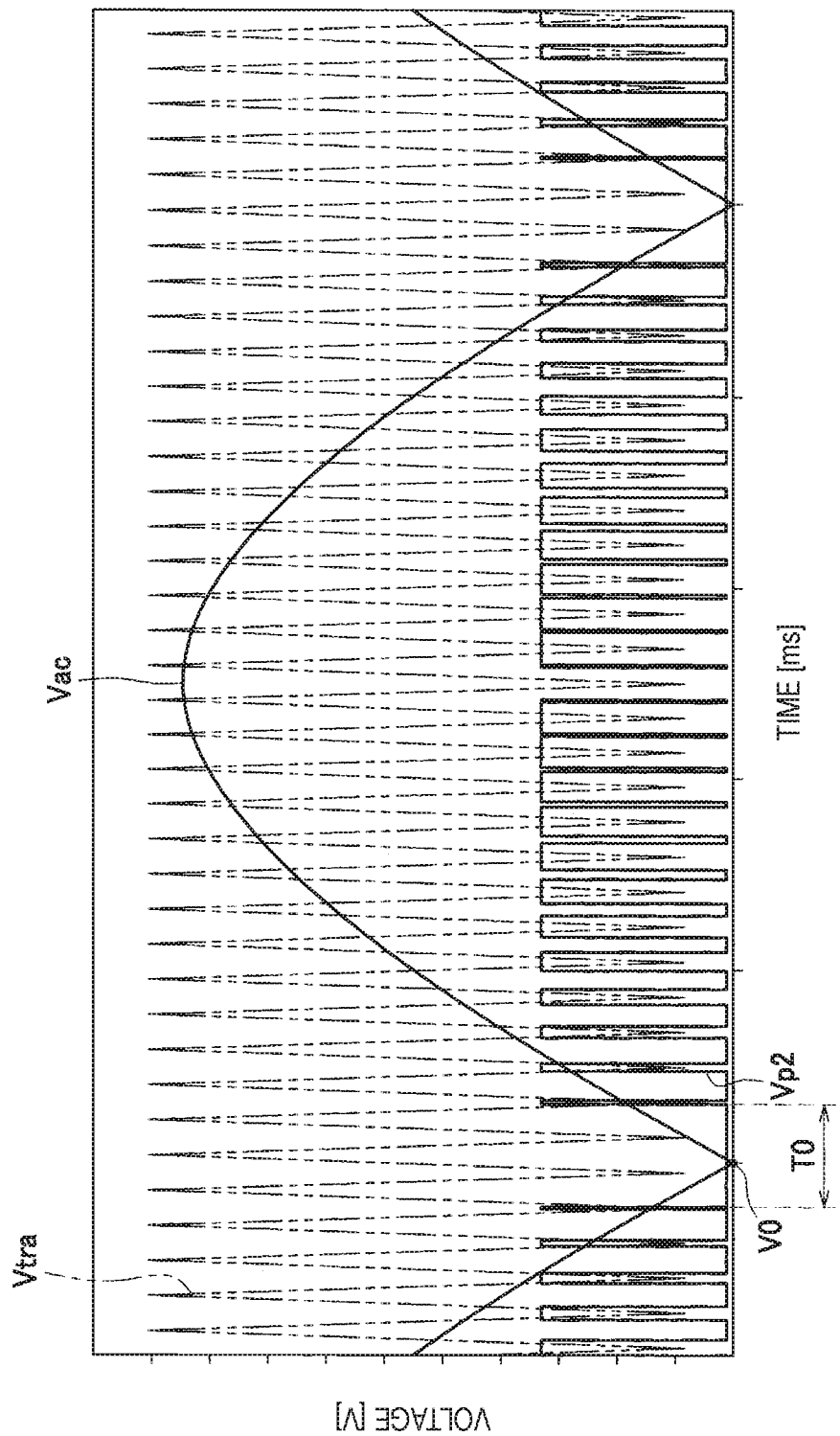
FIG. 6 is a view illustrating a modification in which a lower limit value of a triangular wave is larger than 0.

In the first illustrative embodiment, the minimum value of the triangular wave Vtra is set to 0. However, the present disclosure is not limited thereto. For example, as shown in FIG. 6, the minimum value of the triangular wave Vtra may be set to a value larger than 0. In this case, the pulse-voltage conversion unit 120 may be configured to specify the middle moment of a period T0 when the second pulse signal Vp2 is not output because the duty ratio of the second pulse signal Vp2 is 0, as the moment V0 in time when the AC voltage is 0V. Even though the moment V0 specified by the pulse-voltage conversion unit 120 may differ from the actual moment V0 of the AC voltage due to influence of distortion of the waveform of the AC voltage or the period of triangular wave Vtra, as compared to the method of specifying the moment V0 according to the first illustrative embodiment, it is more unlikely to be influenced by distortion of the waveform of the AC voltage.

Second Illustrative Embodiment

A second illustrative embodiment of the present disclosure will be described in detail with reference to appropriate drawings. The present illustrative embodiment is configured by modifying a part of the structure of the AC voltage detection unit 40 according to the first illustrative embodiment described above. Therefore, components substantially identical to those of the first illustrative embodiment are denoted by the same reference symbols, and a description thereof will not be made.

Figure 7:
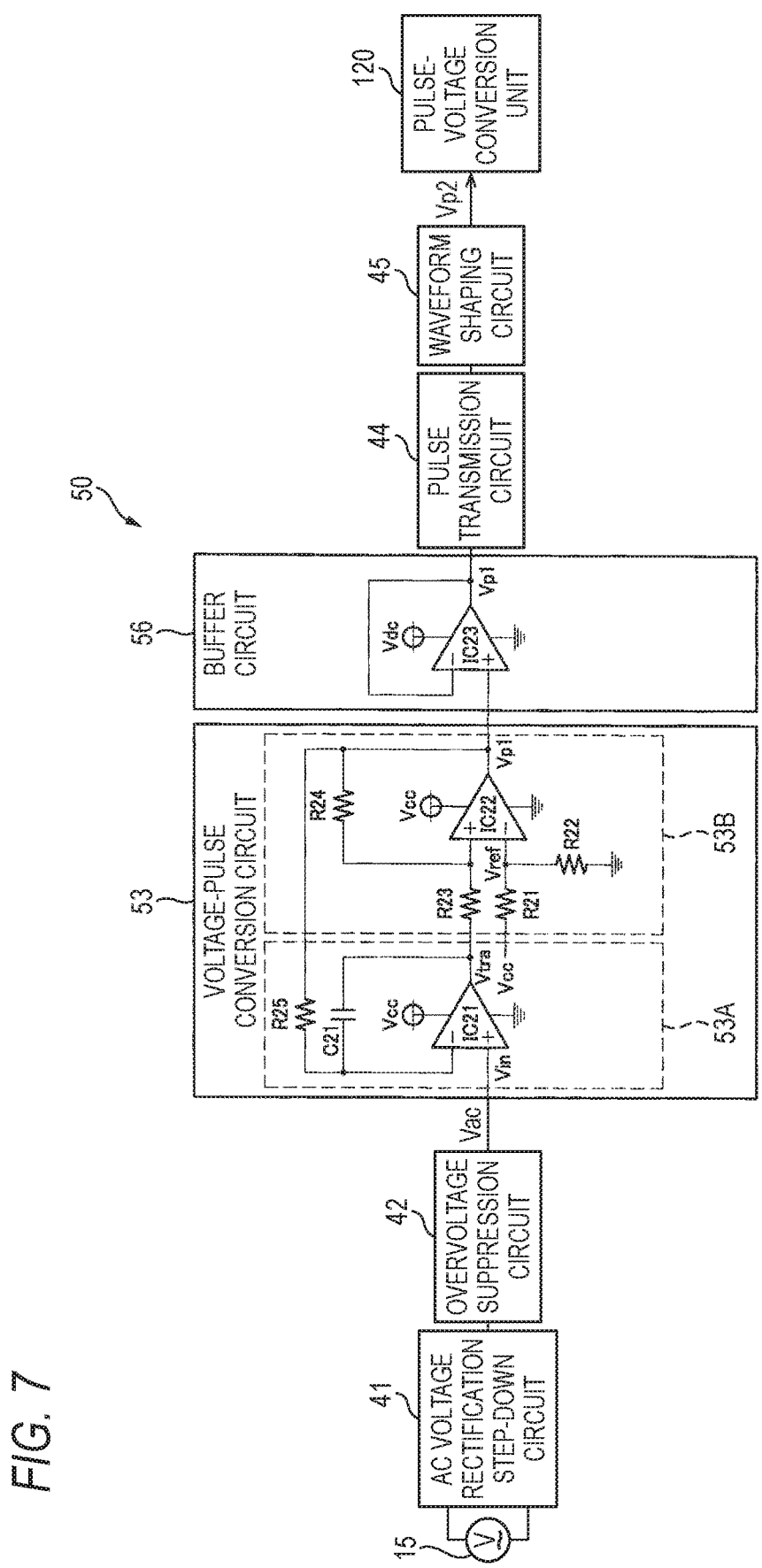
FIG. 7 is a view illustrating an AC voltage detection unit according to a second illustrative embodiment.

As shown in FIG. 7, an AC voltage detection unit 50 according to the second illustrative embodiment includes an AC voltage rectification step-down circuit 41, an overvoltage suppression circuit 42, a pulse transmission circuit 44, a waveform shaping circuit 45, and a pulse-voltage conversion unit 120 substantially identical to those of the first illustrative embodiment, and also includes a voltage-pulse conversion circuit 53 and a buffer circuit 56 unlike the first illustrative embodiment.

The voltage-pulse conversion circuit 53 includes an integrating circuit 53A to which the rectified voltage Vac obtained by rectification of the AC voltage rectification step-down circuit 41 is input, and a first rectangular wave conversion circuit 53B configured to generate the first pulse signal Vp1 by converting an electrical signal output from the integrating circuit 53A to a rectangular wave.

The integrating circuit 53A includes a comparator IC21, a capacitor C21, and a resistor R25. To the comparator IC21, the first voltage Vcc is supplied from the primary-side DC power generation circuit 24. To the non-inversion input terminal (+) of the comparator IC21, the rectified voltage Vac is input. The inversion input terminal (−) of the comparator IC21 is connected to the output terminal of the comparator IC21 via the capacitor C21. The inversion input terminal (−) of the comparator IC21 is connected to the output terminal of a comparator IC22 of the first rectangular wave conversion circuit 53B via the resistor R25.

The first rectangular wave conversion circuit 53B includes the comparator IC22 and resistors R21 to R24. To the comparator IC22, the first voltage Vcc is supplied from the primary-side DC power generation circuit 24. The non-inversion input terminal (+) of the comparator IC22 is connected to the output terminal of the comparator IC21 via the resistor R23. The non-inversion input terminal (+) of the comparator IC22 is connected to the output terminal of the comparator IC22 via the resistor R24.

The inversion input terminal (−) of the comparator IC22 is connected to the primary-side DC power generation circuit 24 configured to output the first voltage Vcc, via the resistor R21. The inversion input terminal (−) of the comparator IC22 is grounded via the resistor R22.

In the voltage-pulse conversion circuit 53, from the comparator IC21, a triangular wave Vtra is output. From the comparator IC22, a first pulse signal Vp1 which is a rectangular wave corresponding to the triangular wave Vtra is output.

Figure 8A:
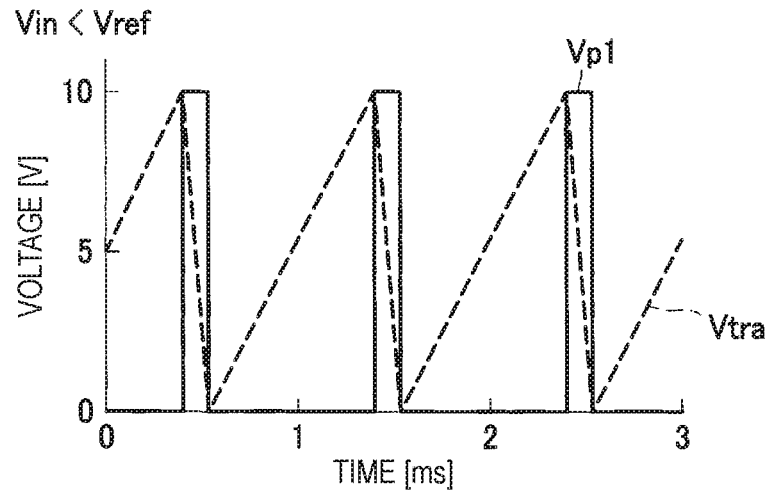
FIGS. 8A to 8C are views illustrating the relation between the triangular wave and a first pulse signal which varies according to the magnitude of an input voltage.
Figure 8B:
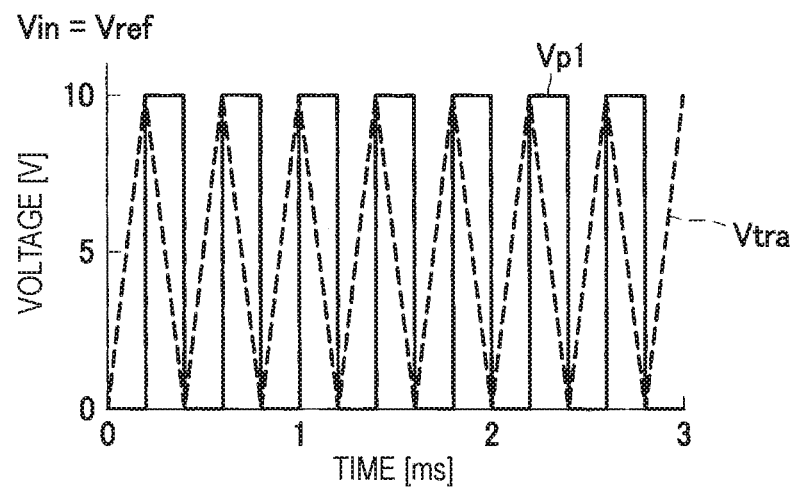
Figure 8C:
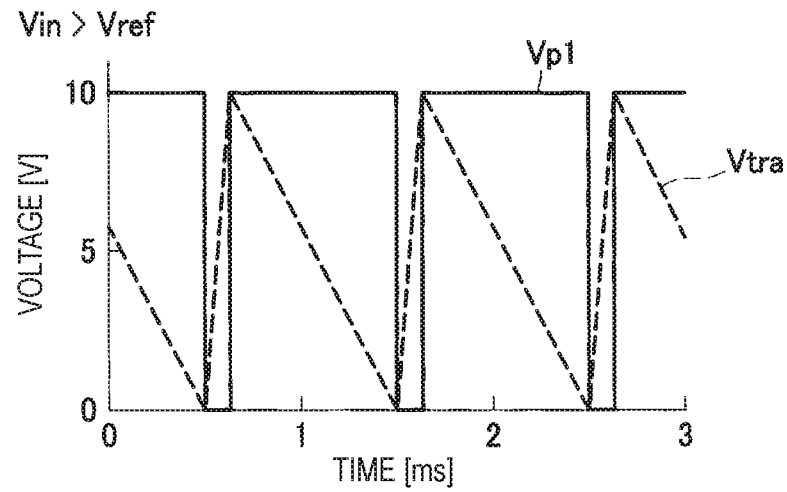

Specifically, as shown in FIG. 8A, when the triangular wave Vtra is rising, the first pulse signal Vp1 becomes a low output; whereas when the triangular wave Vtra is falling, the first pulse signal becomes a high output. As shown in FIGS. 8A to 8C, the rising speed and falling speed of the triangular wave Vtra change according to the relation between an input voltage Vin (Vac) which is input to the non-inversion input terminal (+) of the comparator IC21 and a reference voltage Vref which is input to the inversion input terminal (−) of the comparator IC22.

As shown in FIG. 8B, in the case where the input voltage Vin is equal to the reference voltage Vref, since the rising speed and falling speed of the triangular wave Vtra become equal to each other, the duty ratio of the first pulse signal Vp1 becomes 50%. As shown in FIG. 8A, in the case where the input voltage Vin is lower than the reference voltage Vref, since the rising amount of the triangular wave Vtra in a unit time is smaller than the falling amount of the triangular wave Vtra in the unit time, the low periods of the first pulse signal Vp1 lengthen, and thus the duty ratio of the first pulse signal Vp1 becomes smaller than 50%. As shown in FIG. 8C, in the case where the input voltage Vin is higher than the reference voltage Vref, since the rising amount of the triangular wave Vtra in the unit time is larger than the falling amount of the triangular wave Vtra in the unit time, the high periods of the first pulse signal Vp1 lengthen, and thus the duty ratio of the first pulse signal Vp1 becomes larger than 50%.

FIGS. 8A to 8C show graphs which are obtained if 5V and each of constant voltages (1V, 5V, and 9V) are input as the reference voltage Vref and the input voltage Vin, respectively, for a predetermined time. Actually, the rectified voltage Vac is input as the input voltage Vin. Therefore, according to variation of the value of the rectified voltage Vac, for example, the first pulse signal Vp1 varies in the order of FIG. 8A, FIG. 8B, and FIG. 8C. Therefore, the duty ratio, period, and the like of the first pulse signal Vp1 vary according to the value of the rectified voltage Vac.

FIGS. 9A to 9C are graphs illustrating the relation between the first pulse signal Vp1 and the value of the rectified voltage Vac in the above-mentioned configuration. As shown in FIG. 9A, the duty ratio of the first pulse signal Vp1 is proportional to the value of the rectified voltage Vac. As shown in FIG. 9B, the ON period of the first pulse signal Vp1 increases as the value of the rectified voltage Vac increases, and the increase of the ON period related to the increase of the value of the rectified voltage Vac also increases as the value of the rectified voltage Vac increases.

As shown in FIG. 9C, the period of the first pulse signal Vp1 becomes a minimum value when the rectified voltage Vac is a predetermined value (5V), and lengthens as the rectified voltage Vac increases or decreases from the predetermined value. A graph representing the relation between the frequency of the first pulse signal Vp1 and the value of the rectified voltage Vac has a shape obtained by turning over the graph of FIG. 9C, and thus is not shown in the drawings.

Hereinafter, FIG. 7 will be further described. The buffer circuit 56 is a circuit configured to supply the pulse transmission circuit 44 with a current for driving the pulse transmission circuit 44 on the basis of the first pulse signal Vp1 output from the voltage-pulse conversion circuit 53. The buffer circuit 56 includes a comparator IC23.

To the comparator IC23, the second voltage Vdc different from the first voltage Vcc is supplied from the primary-side DC power generation circuit 24. In other words, in this configuration, different power is respectively supplied to the voltage-pulse conversion circuit 53 and the buffer circuit 56. According to this configuration, since it is possible to generate the first voltage Vcc and suppress variation of the voltage by the voltage stabilizer circuit included in the primary-side DC power generation circuit 24, it is possible to generate an accurate pulse signal by the voltage-pulse conversion circuit 53.

To the non-inversion input terminal (+) of the comparator IC23, the first pulse signal Vp1 is input. The inversion input terminal (−) of the comparator IC23 is connected to the output terminal of the comparator IC23.

According to the above-mentioned configuration, since it is possible to generate the first pulse signal Vp1 having characteristic values such as the duty ratio varying according to the value of the rectified voltage Vac by the voltage-pulse conversion circuit 53, it is possible to obtain the same effects as those of the first illustrative embodiment. However, the period of the first pulse signal Vp1 is not distinguishable between when the value of the rectified voltage Vac is small and when the value of the rectified voltage is large. For this reason, in order to calculate the value of the rectified voltage Vac on the basis of the period, a clipping process of holding the value of the period at the minimum value when the rectified voltage is higher than or lower than a voltage corresponding to the minimum value of the period may be performed. For example, as shown in FIG. 9D, the value of the period may be held at the minimum value when the rectified voltage is higher than the voltage corresponding to the minimum value of the period. According to this configuration, in the case where it is required to grasp the rectified voltage Vac in a range from 0V to 5V, it is possible to calculate the rectified voltage Vac on the basis of the period of the second pulse signal Vp2.

Similarly, with respect to the frequency, a clipping process of holding the value of the frequency at the maximum value when the rectified voltage is higher or lower than a voltage corresponding to the maximum value of the frequency may be performed. For example, as shown in FIG. 9E, the value of the frequency may be held at the maximum value when the rectified voltage is higher than the voltage corresponding to the maximum value of the frequency. According to this configuration, in the case where it is required to grasp the rectified voltage Vac in a range between 0V and 5V, it is possible to calculate the rectified voltage Vac on the basis of the frequency.

Figure 10A:
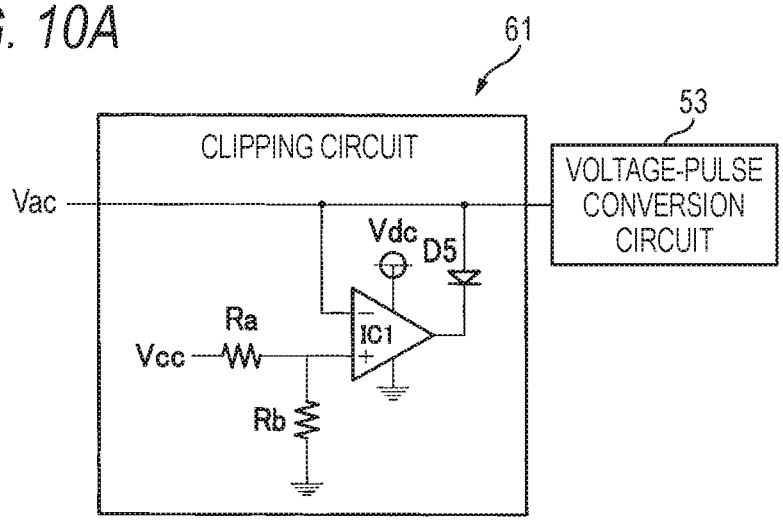
FIGS. 10A and 10B are circuit diagrams illustrating clipping circuits.
Figure 10B:
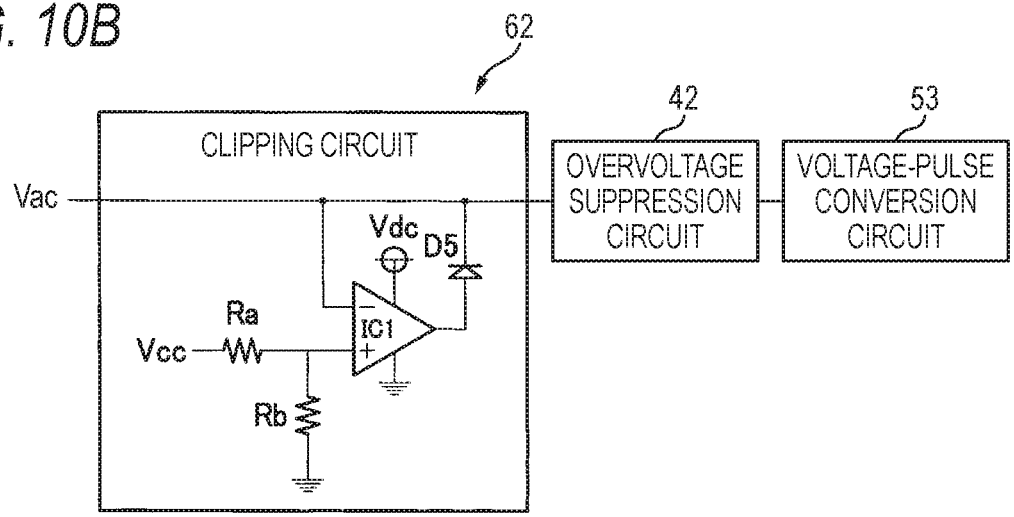

In order to perform such clipping processes, clipping circuits as shown in FIG. 10A and FIG. 10B may be provided. A clipping circuit 61 shown in FIG. 10A is a circuit configured to detect the rectified voltage Vac and output a voltage being equal to an upper limit value to the voltage-pulse conversion circuit 53 in the case where the detected voltage exceeds the upper limit value.

The clipping circuit 61 is a circuit doubling as the overvoltage suppression circuit 42 of the first illustrative embodiment shown in FIG. 3, and includes not only the comparator IC1 and the diode D5 constituting the overvoltage suppression circuit 42 but also resistor Ra and Rb. To the non-inversion input terminal (+) of the comparator IC1, the primary-side DC power generation circuit 24 configured to output the first voltage Vcc is connected via the resistor Ra. The connection point of the non-inversion input terminal (+) of the comparator IC1 and the resistor Ra is grounded via the resistor Rb. The other circuit configuration is identical to that of the overvoltage suppression circuit 42, and thus a description thereof will not be made.

If the clipping circuit 61 configured as described above is provided, it is possible to obtain the graphs of the period and the frequency as shown in FIG. 9D and FIG. 9E.

The clipping circuit 62 shown in FIG. 10B is a circuit configured to detect the rectified voltage Vac and output a voltage being equal to a lower limit value to the voltage-pulse conversion circuit 53 via the overvoltage suppression circuit 42 in the case where the detected voltage exceeds the lower limit. The clipping circuit 62 is a circuit which is obtained only by reversing the diode D5 of the clipping circuit 61 shown in FIG. 10A.

If the clipping circuit 62 configured as described above is provided, for example, it is possible to hold the value of the period at the minimum value when the rectified voltage is lower than the voltage corresponding to the minimum value of the period.

Third Illustrative Embodiment

A third illustrative embodiment of the present disclosure will be described in detail with reference to appropriate drawings. The present illustrative embodiment is configured by modifying a part of the structure of the AC voltage detection unit 50 according to the second illustrative embodiment described above. Therefore, components substantially identical to those of the second illustrative embodiment are denoted by the same reference symbols, and a description thereof will not be made.

Figure 11:
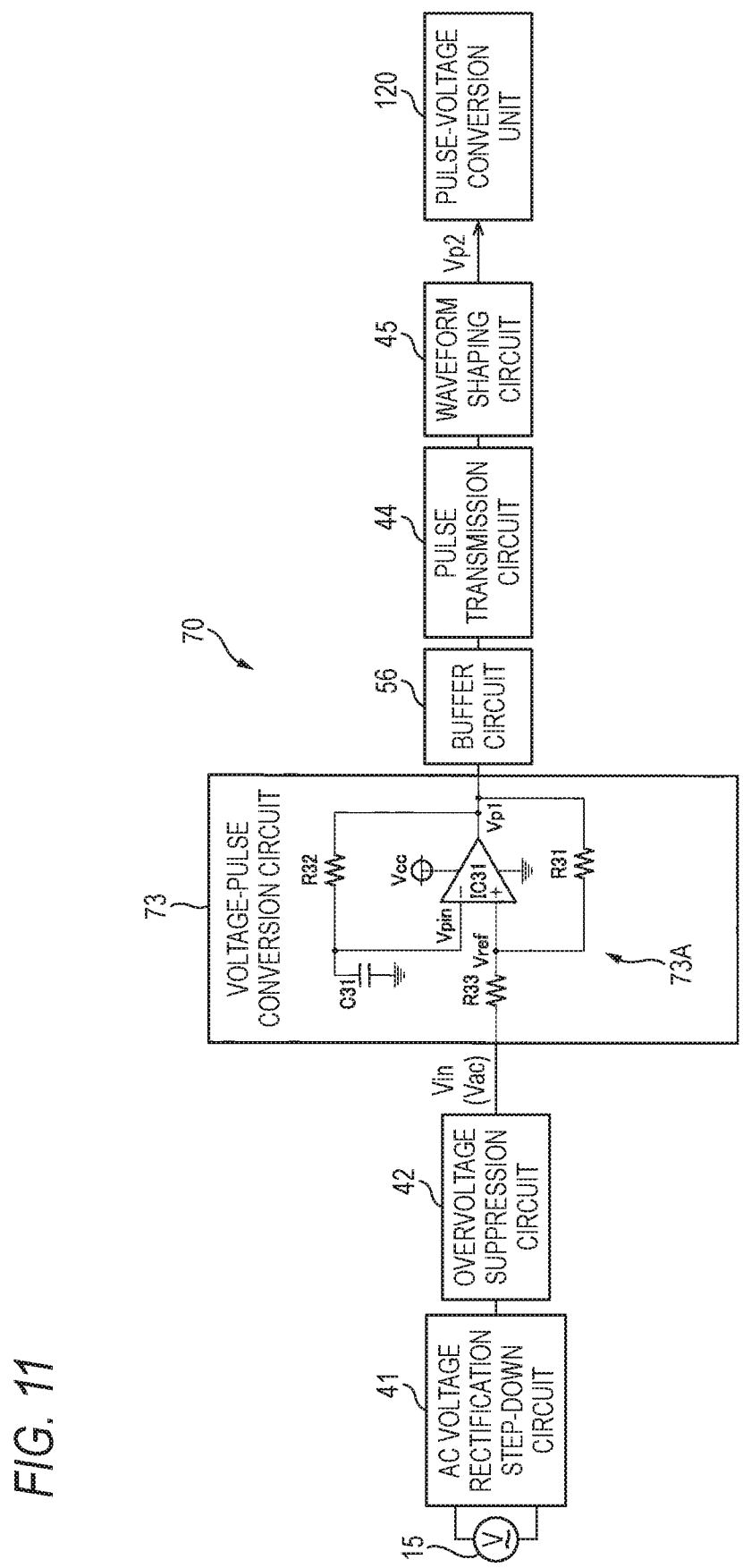
FIG. 11 is a view illustrating an AC voltage detection unit according to a third illustrative embodiment.

As shown in FIG. 11, an AC voltage detection unit 70 according to the third illustrative embodiment has the same structure as that of the second illustrative embodiment except that it includes a voltage-pulse conversion circuit 73 different from that of the second illustrative embodiment.

The voltage-pulse conversion circuit 73 includes a second rectangular wave conversion circuit 73A configured to generate a first pulse signal Vp1 by converting the rectified voltage Vac to a rectangular wave. The second rectangular wave conversion circuit 73A includes a comparator IC31, resistors R31 to R33, and a capacitor C31.

The comparator IC31 is supplied with the first voltage Vcc from the primary-side DC power generation circuit 24. To the non-inversion input terminal (+) of the comparator IC31, the rectified voltage Vac is input via the resistor R33. The connection point of the non-inversion input terminal (+) of the comparator IC31 and the resistor R33 is connected to the output terminal of the comparator IC31 via the resistor R31.

The inversion input terminal (−) of the comparator IC31 is grounded via the capacitor C31. The connection point of the inversion input terminal (−) of the comparator IC31 and the capacitor C31 is connected to the output terminal of the comparator IC31 via the resistor R32.

In the voltage-pulse conversion circuit 73, if the rectified voltage Vac is input to the non-inversion input terminal (+) of the comparator IC31 via the resistor R33, from the output terminal of the comparator IC31, the first pulse signal Vp1 corresponding to the rectified voltage Vac is output.

Specifically, in the case where a reference voltage Vref which is a voltage between the non-inversion input terminal (+) of the comparator IC31 and the resistor R33 is higher than a feedback voltage Vpin which is a voltage input to the inversion input terminal (−) of the comparator IC31, the first pulse signal Vp1 to be output from the comparator IC31 becomes the high output (Vcc). In the case where the reference voltage Vref is lower than the feedback voltage Vpin, the first pulse signal Vp1 to be output from the comparator IC31 becomes the low output (0V).

Figure 12A:
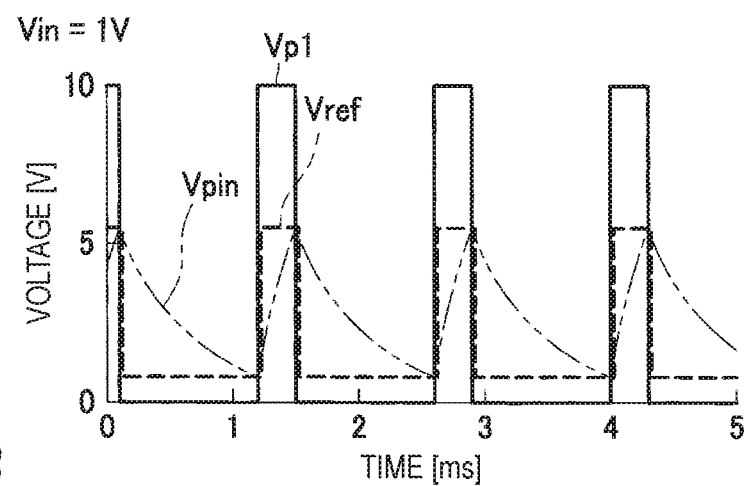
FIGS. 12A to 12C are views illustrating the relation of input voltage, reference voltage, and the first pulse signal which varies according to the magnitude of the input voltage.

The feedback voltage Vpin varies according to charging and discharging of the capacitor C31, for example, as shown in FIG. 12A. Specifically, while the first pulse signal Vp1 output from the comparator IC31 is the high output, since the capacitor C31 is gradually charged, the feedback voltage Vpin gradually increases. Further, while the first pulse signal Vp1 output from the comparator IC31 is the low output, since the capacitor C31 is being discharged, the feedback voltage Vpin gradually decreases.

Meanwhile, the reference voltage Vref also varies according to the output of the comparator IC31, i.e. the first pulse signal Vp1. Specifically, the reference voltage Vref varies so as to satisfy the following expression (1).

$$Vref = Vin + (Vp1 - Vin) \times R31/(R31 + R33) \quad (1)$$

Here, Vin is an input voltage which is applied to the side opposite to the comparator IC31 across the resistor R33.

Hereinafter, variation of the reference voltage Vref will be described in detail by applying specific numeric values to expression (1). The specific numeric values are as follow.

Vp1 (During High Output)=Vcc=10V
Vp1 (During Low Output)=0V
R31=R32=R33=100 kΩ
Vin=1V In the case where the first pulse signal Vp1 output from the comparator IC31 is the high output, the reference voltage Vref becomes the following value.

$$Vref=1+(10-1)\times100/(100+100)=5.5(V)$$

In the case where the first pulse signal Vp1 output from the comparator IC31 is the low output, the reference voltage Vref becomes the following value.

$$Vref=1+(0-1)\times100/(100+100)=0.5(V)$$

Therefore, as shown in FIG. 12A, the reference voltage Vref is switched between a high output and a low output in a range between 0.5V and 5.5V, in sync with the switching timings of the first pulse signal Vp1 between the high output and the low output.

In the initial state where inputting of the input voltage Vin is started, since the feedback voltage Vpin is not input to the comparator IC31, the reference voltage Vref is higher than the feedback voltage Vpin, and thus the first pulse signal Vp1 becomes the high output. If the first pulse signal Vp1 becomes the high output as described above, the capacitor C31 is gradually charged, and the feedback voltage Vpin gradually increases. In this case, the reference voltage Vref becomes 5.5V on the basis of the above-mentioned expression (1).

Thereafter, if the feedback voltage Vpin becomes higher than 5.5V, the first pulse signal Vp1 is switched to the low output. As a result, the electric charge of the capacitor C31 is gradually released, and the feedback voltage Vpin gradually decreases. In this case, the reference voltage Vref becomes 0.5V according to the above-mentioned expression (1). Thereafter, if the feedback voltage Vpin becomes lower than 0.5V, the first pulse signal Vp1 is switched to the high output. Since this operation is repeated, it is possible to the first pulse signal Vp1 shown in FIG. 12A while the input voltage Vin of 1V is being input.

Figure 12B:
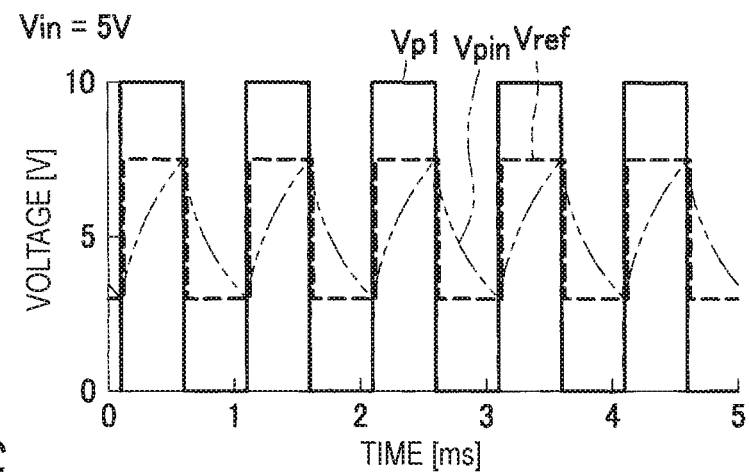

As shown in FIG. 12B, when the input voltage Vin is 5V, the reference voltage Vref changes in a range between 2.5V and 7.5V on according to the above-mentioned expression (1). The feedback voltage Vpin which is switched between rising and falling by using the reference voltage Vref as a threshold also varies in the range between 2.5V and 7.5V.

Figure 12C:
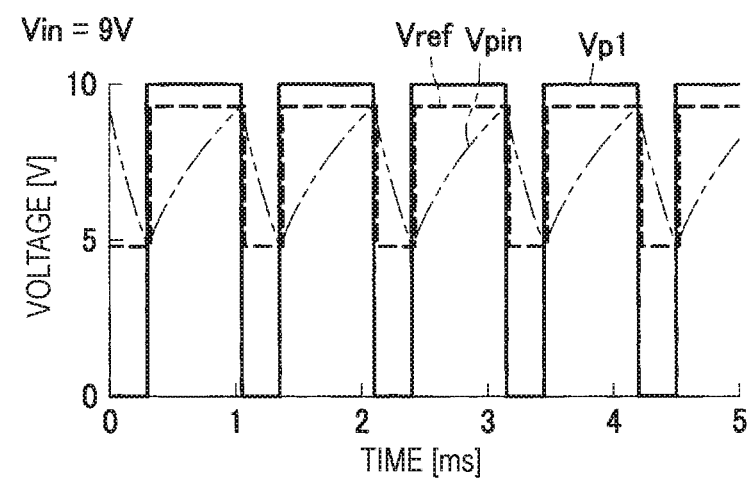

As shown in FIG. 12C, when the input voltage Vin is 9V, the reference voltage Vref varies in a range between 4.5V and 9.5V according to the above-mentioned expression (1). The feedback voltage Vpin which is switched between rising and falling by using the reference voltage Vref as a threshold also varies in the range between 4.5V and 9.5V.

Figure 13:
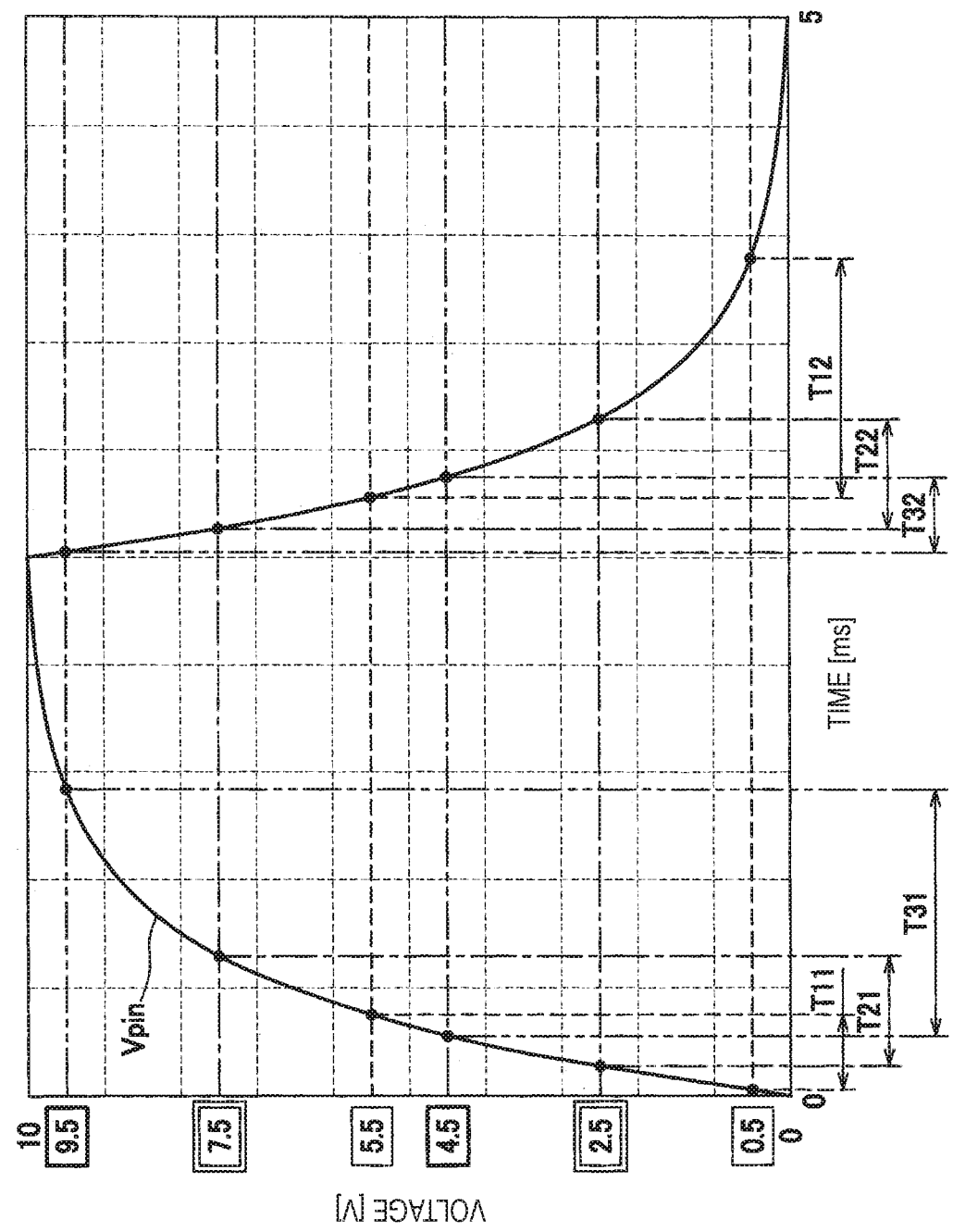
FIG. 13 is a view illustrating variation of feedback voltage according to charging and discharging of a capacitor.

FIG. 13 is a view illustrating a characteristic of the feedback voltage Vpin when the feedback voltage rises until the capacitor C31 is fully charged from a fully discharged state, and a characteristic of the feedback voltage Vpin when the feedback voltage falls until the capacitor C31 is fully discharged from the fully charged state. As shown in FIG. 13, the gradient when the feedback voltage Vpin rises until the capacitor C31 is fully charged from the fully discharged state tends to be large at first and gradually decrease. The gradient the feedback voltage Vpin falls until the capacitor C31 is fully discharged from the fully charged state tends to be large at first and gradually decrease.

Therefore, a time T11 it takes for the feedback voltage Vpin to rise from 0.5V to the 5.5V is longer than a time T21 it takes for the feedback voltage Vpin to rise from 2.5V to 7.5V. A time T31 it takes for the feedback voltage Vpin to rise from 4.5V to 9.5V is longer than the time T21. In other words, the time T21 it takes for the feedback voltage Vpin to rise when the input voltage Vin is 5V is longer than the time T11 it takes for the feedback voltage Vpin to rise when the input voltage Vin is 1V, and the time T31 it takes for the feedback voltage Vpin to rise when the input voltage Vin is 9V is longer than the time T21.

A time T12 it takes for the feedback voltage Vpin to fall from 5.5V to 0.5V is longer than a time T22 it takes for the feedback voltage Vpin to fall from 7.5V to 2.5V. The time T22 is longer than a time T32 it takes for the feedback voltage Vpin to fall from 9.5V to 4.5V. In other words, the time T12 it takes for the feedback voltage Vpin to fall when the input voltage Vin is 1V is longer than the time T22 it takes for the feedback voltage Vpin to fall when the input voltage Vin is 5V, and the time T22 is longer than the time T32 it takes for the feedback voltage Vpin to fall when the input voltage Vin is 9V.

As described above, the time it takes for the feedback voltage Vpin to rise and fall depends on the magnitude of the input voltage Vin. Therefore, as shown in FIGS. 12A to 12C, characteristics of the first pulse signal Vp1 such as the duty ratio and the period depend on the magnitude of the input voltage Vin. FIGS. 12A to 12C show graphs which are obtained if each of constant voltages (1V, 5V, and 9V) is input as the input voltage Vin for a predetermined time. Actually, the rectified voltage Vac is input as the input voltage Vin. Therefore, according to variation of the value of the rectified voltage Vac, for example, the first pulse signal Vp1 varies as shown in FIGS. 12A to 12C. Therefore, the duty ratio, period, and the like of the first pulse signal Vp1 vary according to the value of the rectified voltage Vac.

FIGS. 14A to 14C are graphs illustrating the relation between the first pulse signal Vp1 and the value of the rectified voltage Vac according to the above-described configuration. As shown in FIG. 14A, the duty ratio of the first pulse signal Vp1 is substantially proportional to the value of the rectified voltage Vac. As shown in FIG. 14B, the ON period of the first pulse signal Vp1 increases as the value of the rectified voltage Vac, and the increase of the ON period related to the increase of the value of the rectified voltage Vac also increases as the value of the rectified voltage Vac increases.

As shown in FIG. 14C, the period of the first pulse signal Vp1 becomes a minimum value when the rectified voltage Vac is a predetermined value (5V), and lengthens as the rectified voltage Vac increases or decreases from the predetermined value. A graph representing the relation between the frequency of the first pulse signal Vp1 and the value of the rectified voltage Vac has a shape obtained by turning over the graph of FIG. 14C, and thus is not shown in the drawings. FIG. 14D and FIG. 14E show graphs illustrating the period and frequency of the first pulse signal Vp1 subjected to clipping processes, respectively.

Even in the above-described configuration, similarly to the second illustrative embodiment, it is possible to calculate the rectified voltage Vac on the basis of the period and the like.

However, the present disclosure is not limited to the above-described illustrative embodiments, and can be used in various forms as follows.

In the above-described illustrative embodiments, the pulse transmission circuit 44 having the photocoupler PC1 has been described as an example; however, the present disclosure is not limited thereto. For example, the pulse transmission circuit may include a transformer for converting the first pulse signal to a magnetic signal which is a physical signal.

In the above-described illustrative embodiments, the configuration including the pulse transmission circuit 44 for converting the first pulse signal to a physical signal other than an electrical signal has been described as an example; however, the present disclosure is not limited thereto. For example, instead of the pulse transmission circuit 44 of the illustrative embodiments described above, a capacitor for converting the first pulse signal to the second pulse signal may be provided.

In the above-described illustrative embodiments, the present disclosure is applied to the printer 1. However, the present disclosure is not limited thereto, and the present disclosure can be applied to others such as industrial machines. In the above-described illustrative embodiments, as an example of the AC voltage detection device, the AC voltage detection unit 40 constituting a part of the power supply system ST has been described. However, the present disclosure is not limited thereto. For example, the AC voltage detection device may be provided separately from the power supply system.

In the above-described illustrative embodiments, as an example of the image forming apparatus, the printer 1 has been described. However, the present disclosure is not limited thereto, and the image forming apparatus may be others such as copy machines and multi-function apparatuses.

The individual elements described in the illustrative embodiments and the modifications may be arbitrarily combined.

What is claimed is:

1. An AC voltage detection device comprising:
   a rectifying circuit configured to rectify an AC voltage output from an AC power source;
   a voltage-pulse conversion circuit connected to the rectifying circuit, and configured to convert the rectified voltage rectified in the rectifying circuit to a first pulse signal having a period shorter than a half of a period of the AC voltage and having a variation according to the rectified voltage changes in level;
   a pulse transmission circuit connected to the voltage-pulse conversion circuit, and configured to perform signal transmission with electrical insulation by converting the first pulse signal, which is converted in the voltage-pulse conversion circuit, to a physical signal other than an electrical signal and converting the physical signal to a second pulse signal being an electrical signal and having a variation according to the rectified voltage changes in level; and
   a controller to which the second pulse signal is input.

2. The AC voltage detection device according to claim 1, wherein the voltage-pulse conversion circuit includes a triangular wave generating circuit configured to generate a triangular wave having a uniform period shorter than a half of the period of the AC voltage, and a comparison circuit configured to compare the rectified voltage and the triangular wave.

3. The AC voltage detection device according to claim 2, wherein the controller is configured to calculate the AC voltage based on a duty ratio of the second pulse signal.

4. The AC voltage detection device according to claim 3, wherein in a case where the controller is not enabled to specify a moment in time when the AC voltage is 0V based on the duty ratio of the second pulse signal, the controller is configured to specify the moment in time when the AC voltage is 0V based on two different duty ratios and moments in time when the two duty ratios are detected.

5. The AC voltage detection device according to claim 4, wherein the two duty ratios for calculating the moment in time when the AC voltage is 0V are consecutively detected, and
one of the two duty ratios is a value detected when the AC voltage is closest to 0V, and the other is a value detected when the AC voltage is second closest to 0V.

6. The AC voltage detection device according to claim 2, wherein the controller is configured to calculate the AC voltage based on an ON period of the second pulse signal.

7. The AC voltage detection device according to claim 2, wherein a minimum value of the triangular wave is set to a value larger than 0, and
the controller is configured to:
   calculate the AC voltage based on a duty ratio of the second pulse signal; and
   specify a middle moment of a period when the duty ratio of the second pulse signal is 0 as a moment in time when the AC voltage is 0V.

8. The AC voltage detection device according to claim 1, wherein the voltage-pulse conversion circuit includes an integrating circuit to which the rectified voltage is input, and a first rectangular wave conversion circuit configured to generate the first pulse signal by converting an electrical signal output from the integrating circuit to a rectangular wave, and
the period of the first pulse signal depends on a value of the rectified voltage.

9. The AC voltage detection device according to claim 8, wherein the controller is configured to calculate the AC voltage based on a period of the second pulse signal.

10. The AC voltage detection device according to claim 9, further comprising:
a clipping circuit configured to detect the rectified voltage and output a voltage being equal to an upper limit value to the voltage-pulse conversion circuit in a case where the detected rectified voltage exceeds the upper limit value.

11. The AC voltage detection device according to claim 9, further comprising:
a clipping circuit configured to detect the rectified voltage and output a voltage being equal to a lower limit value to the voltage-pulse conversion circuit in a case where the detected rectified voltage exceeds the lower limit value.

12. The AC voltage detection device according to claim 8, further comprising:
a buffer circuit configured to supply the pulse transmission circuit with a current for driving the pulse transmission circuit based on the first pulse signal,
wherein a voltage for the voltage-pulse conversion circuit is supplied from a first DC power supply, and
a voltage for the buffer circuit is supplied from a second DC power supply different from the first DC power supply.

13. The AC voltage detection device according to claim 1, wherein the voltage-pulse conversion circuit includes a second rectangular wave conversion circuit configured to generate the first pulse signal by converting the rectified voltage to a rectangular wave, and
the period of the first pulse signal depends on a value of the rectified voltage.

14. The AC voltage detection device according to claim 1, further comprising:
   an overvoltage suppression circuit configured to suppress the rectified voltage from achieving an overvoltage.

15. The AC voltage detection device according to claim 1, further comprising:
   a waveform shaping circuit configured to shape a waveform of the second pulse signal output from the pulse transmission circuit.

16. The AC voltage detection device according to claim 1, wherein the pulse transmission circuit includes a photocoupler configured to convert the first pulse signal to a light signal as the physical signal.

17. The AC voltage detection device according to claim 1, wherein the pulse transmission circuit includes a transformer configured to convert the first pulse signal to a magnetic signal as the physical signal.

18. An image forming apparatus comprising:
   the AC voltage detection device according to claim 1.

19. An industrial machine comprising:
   the AC voltage detection device according to claim 1.

20. The AC voltage detection device according to claim 1, wherein the controller is configured to calculate a voltage value of the AC voltage from a characteristic value of the second pulse signal.

21. The AC voltage detection device according to claim 1, wherein the rectifying circuit includes a bridge diode, and the voltage-pulse conversion circuit is connected to the bridge diode.

22. An AC voltage detection device comprising:
   a rectifying circuit configured to rectify an AC voltage output from an AC power source;
   a voltage-pulse conversion circuit connected to the rectifying circuit, and configured to convert the rectified voltage rectified in the rectifying circuit to a first pulse signal having a period shorter than a half of a period of the AC voltage and having a variation according to the rectified voltage changes in level;
   a capacitor connected to the voltage-pulse conversion circuit, and configured to convert the first pulse signal, which is converted in the voltage-pulse conversion circuit, to a second pulse signal; and
   a controller to which the second pulse signal is input.

* * * * *